(12) United States Patent
Ohno et al.

(10) Patent No.: US 10,259,207 B2
(45) Date of Patent: Apr. 16, 2019

(54) METHOD FOR FORMING SEPARATION STARTING POINT AND SEPARATION METHOD

(71) Applicant: Semiconductor Energy Laboratory Co., Ltd., Atsugi-shi, Kanagawa-ken (JP)

(72) Inventors: Masakatsu Ohno, Utsunomiya (JP); Koichi Takeshima, Sano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 12 days.

(21) Appl. No.: 15/413,696

(22) Filed: Jan. 24, 2017

(65) Prior Publication Data

US 2017/0210115 A1     Jul. 27, 2017

(30) Foreign Application Priority Data

Jan. 26, 2016   (JP) ................................. 2016-011991

(51) Int. Cl.
  *B32B 43/00*   (2006.01)
  *H01L 21/683*  (2006.01)
  (Continued)

(52) U.S. Cl.
  CPC ........ *B32B 43/006* (2013.01); *H01L 21/6835* (2013.01); *H01L 27/1266* (2013.01); (Continued)

(58) Field of Classification Search
  CPC .................. B32B 38/10; B32B 43/006; B32B 2310/0843; B32B 37/02; B32B 37/025; B32B 37/1284; B32B 37/18; Y10T 156/1126; Y10T 156/1132; Y10T 156/1933; Y10T 156/1184;
  (Continued)

(56) References Cited

U.S. PATENT DOCUMENTS 5,821,138 A   10/1998  Yamazaki et al.
5,854,123 A   12/1998  Sato
   (Continued)

FOREIGN PATENT DOCUMENTS

EP    0858110 B    12/2006
JP    10-125931 A   5/1998
   (Continued)

*Primary Examiner* — Mark A Osele
*Assistant Examiner* — Nickolas R Harm
(74) *Attorney, Agent, or Firm* — Robinson Intellectual Property Law Office; Eric J. Robinson

(57) ABSTRACT

A starting point for separating a separation layer and a layer to be separated is formed in a process member. A first step of irradiating a first portion of the process member with first laser light in a frame-like shape and a second step of irradiating at least part of a region which is irradiated with the first laser light with second laser light are performed. The process member includes a first substrate, the separation layer, the layer to be separated, and an adhesive layer which are stacked in this order. In the first portion, the adhesive layer overlaps with the first substrate with the separation layer and the layer to be separated provided therebetween. In the first step, the first laser light is absorbed by at least the layer to be separated and the adhesive layer. In the second step, the second laser light is absorbed by at least the separation layer.

21 Claims, 24 Drawing Sheets

(51) Int. Cl.
*H01L 27/12* (2006.01)
*H01L 51/00* (2006.01)
*B32B 37/18* (2006.01)
*H01L 51/56* (2006.01)
*B32B 38/10* (2006.01)
*B32B 37/02* (2006.01)
*B32B 37/12* (2006.01)
*B32B 37/00* (2006.01)
*H01L 27/32* (2006.01)

(52) U.S. Cl.
CPC ............ *H01L 51/003* (2013.01); *B32B 37/02* (2013.01); *B32B 37/025* (2013.01); *B32B 37/1284* (2013.01); *B32B 37/18* (2013.01); *B32B 38/10* (2013.01); *B32B 2310/0843* (2013.01); *H01L 27/3244* (2013.01); *H01L 51/0024* (2013.01); *H01L 51/0097* (2013.01); *H01L 51/56* (2013.01); *H01L 2221/68381* (2013.01); *H01L 2227/326* (2013.01); *Y10T 156/1126* (2015.01); *Y10T 156/1132* (2015.01); *Y10T 156/1168* (2015.01); *Y10T 156/1184* (2015.01); *Y10T 156/1933* (2015.01); *Y10T 156/1944* (2015.01); *Y10T 156/1967* (2015.01)

(58) Field of Classification Search
CPC ......... Y10T 156/1944; Y10T 156/1967; H01L 27/1266; H01L 51/0024; H01L 51/003; H01L 51/0097; H01L 51/56; H01L 2221/68381; H01L 2221/68386; H01L 2227/326
USPC ....... 156/701, 706, 712, 714, 717, 753, 762, 156/924
See application file for complete search history.

(56) References Cited

U.S. PATENT DOCUMENTS

| | | | |
|---|---|---|---|
| 5,891,298 A | 4/1999 | Kuroda et al. | |
| 6,072,239 A | 6/2000 | Yoneda et al. | |
| 6,100,166 A | 8/2000 | Sakaguchi et al. | |
| 6,127,199 A | 10/2000 | Inoue et al. | |
| 6,326,279 B1 | 12/2001 | Kakizaki et al. | |
| 6,372,608 B1 | 4/2002 | Shimoda et al. | |
| 6,391,220 B1 | 5/2002 | Zhang et al. | |
| 6,452,091 B1 | 9/2002 | Nakagawa et al. | |
| 6,544,430 B2 | 4/2003 | Mccormack et al. | |
| 6,592,739 B1 | 7/2003 | Sonoda et al. | |
| 6,682,963 B2 | 1/2004 | Ishikawa | |
| 6,846,696 B2 | 1/2005 | Adachi et al. | |
| 6,849,877 B2 | 2/2005 | Yamazaki et al. | |
| 6,946,361 B2 | 9/2005 | Takayama et al. | |
| 6,953,735 B2 | 10/2005 | Yamazaki et al. | |
| 6,982,181 B2 | 1/2006 | Hideo | |
| 7,015,075 B2 | 3/2006 | Fay et al. | |
| 7,029,950 B2 | 4/2006 | Yonehara et al. | |
| 7,045,438 B2 | 5/2006 | Yamazaki et al. | |
| 7,056,810 B2 | 6/2006 | Yamazaki et al. | |
| 7,060,153 B2 | 6/2006 | Yamazaki et al. | |
| 7,067,392 B2 | 6/2006 | Yamazaki et al. | |
| 7,122,445 B2 | 10/2006 | Takayama et al. | |
| 7,122,447 B2 | 10/2006 | Abe | |
| 7,147,740 B2 | 12/2006 | Takayama et al. | |
| 7,180,091 B2 | 2/2007 | Yamazaki et al. | |
| 7,180,093 B2 | 2/2007 | Takayama et al. | |
| 7,189,631 B2 | 3/2007 | Yamazaki et al. | |
| 7,241,666 B2 | 7/2007 | Goto et al. | |
| 7,245,331 B2 | 7/2007 | Yamazaki et al. | |
| 7,262,088 B2 | 8/2007 | Kodaira et al. | |
| 7,271,076 B2 | 9/2007 | Yamazaki et al. | |
| 7,282,380 B2 | 10/2007 | Maruyama et al. | |
| 7,332,381 B2 | 2/2008 | Maruyama et al. | |
| 7,335,573 B2 | 2/2008 | Takayama et al. | |
| 7,351,300 B2 | 4/2008 | Takayama et al. | |
| 7,436,050 B2 | 10/2008 | Yamazaki et al. | |
| 7,465,674 B2 | 12/2008 | Tamura et al. | |
| 7,482,248 B2 | 1/2009 | Tamura | |
| 7,521,383 B2 | 4/2009 | Morisue et al. | |
| 7,536,780 B2 | 5/2009 | Shimizu et al. | |
| 7,540,079 B2 | 6/2009 | Okuyama et al. | |
| 7,566,633 B2 | 7/2009 | Koyama et al. | |
| 7,566,640 B2 | 7/2009 | Yamazaki et al. | |
| 7,591,863 B2 | 9/2009 | Watanabe et al. | |
| 7,601,236 B2 | 10/2009 | Yamashita et al. | |
| 7,608,520 B2 | 10/2009 | Sugita et al. | |
| 7,611,965 B2 | 11/2009 | Suzuki et al. | |
| 7,723,209 B2 | 5/2010 | Maruyama et al. | |
| 7,732,263 B2 | 6/2010 | Yamazaki et al. | |
| 7,767,543 B2 | 8/2010 | Tateishi et al. | |
| 7,820,526 B2 | 10/2010 | Yamada et al. | |
| 7,867,907 B2 | 1/2011 | Shimomura et al. | |
| 7,927,971 B2 | 4/2011 | Tamura et al. | |
| 8,030,132 B2 | 10/2011 | Ogita et al. | |
| 8,043,936 B2 | 10/2011 | Eguchi et al. | |
| 8,048,770 B2 | 11/2011 | Eguchi et al. | |
| 8,048,777 B2 | 11/2011 | Eguchi et al. | |
| 8,058,083 B2 | 11/2011 | Eguchi et al. | |
| 8,058,146 B2 | 11/2011 | Kuwabara | |
| 8,110,442 B2 | 2/2012 | Jinbo | |
| 8,123,896 B2 | 2/2012 | Watanabe et al. | |
| 8,137,417 B2 | 3/2012 | Eguchi et al. | |
| 8,367,440 B2 | 2/2013 | Takayama et al. | |
| 8,749,063 B2 | 6/2014 | Tsurume | |
| 8,911,653 B2 | 12/2014 | Yamazaki et al. | |
| 9,040,420 B2 | 5/2015 | Sugiyama et al. | |
| 9,053,401 B2 | 6/2015 | Watanabe et al. | |
| 9,184,211 B2 | 11/2015 | Hirakata | |
| 9,257,560 B2 | 2/2016 | Adachi et al. | |
| 9,333,736 B2 | 5/2016 | Kumakura et al. | |
| 9,437,832 B2 | 9/2016 | Sakuishi et al. | |
| 2003/0022403 A1 | 1/2003 | Shimoda et al. | |
| 2003/0082889 A1 | 5/2003 | Maruyama et al. | |
| 2004/0209442 A1 | 10/2004 | Takakuwa et al. | |
| 2005/0176180 A1 | 8/2005 | Fay et al. | |
| 2005/0214984 A1 | 9/2005 | Maruyama et al. | |
| 2005/0229370 A1 | 10/2005 | Kobayashi | |
| 2008/0011420 A1 | 1/2008 | Yoshizawa et al. | |
| 2008/0132033 A1 | 6/2008 | Eguchi et al. | |
| 2008/0182385 A1 | 7/2008 | Kamine | |
| 2008/0259575 A1 | 10/2008 | Tanimura et al. | |
| 2009/0023251 A1 | 1/2009 | Eguchi et al. | |
| 2010/0096090 A1 | 4/2010 | Yoshioka et al. | |
| 2010/0124795 A1 | 5/2010 | Eguchi et al. | |
| 2012/0045861 A1 | 2/2012 | Eguchi et al. | |
| 2015/0044792 A1 | 2/2015 | Aoyama et al. | |
| 2015/0069358 A1 | 3/2015 | Chida et al. | |
| 2015/0075720 A1 | 3/2015 | Hirakata et al. | |
| 2015/0123106 A1 | 5/2015 | Yasumoto et al. | |
| 2016/0239124 A1 | 8/2016 | Chida | |
| 2017/0177116 A1 | 6/2017 | Jinbo et al. | |

FOREIGN PATENT DOCUMENTS

| | | |
|---|---|---|
| JP | 2003-174153 A | 6/2003 |
| JP | 2006-279031 A | 10/2006 |
| JP | 2008-109123 A | 5/2008 |
| JP | 2010-153804 A | 7/2010 |

FIG. 1A1
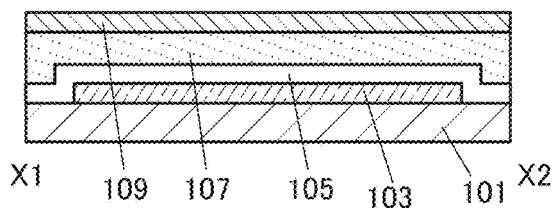
FIG. 1A2
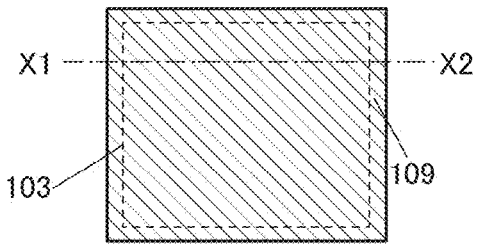
FIG. 1B1
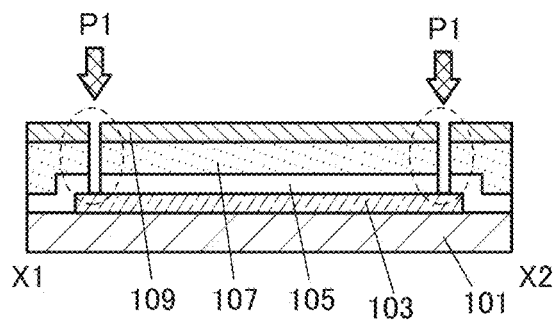
FIG. 1B2
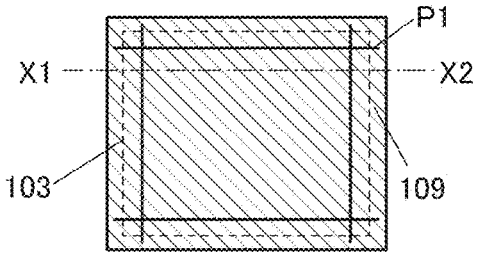
FIG. 1B3
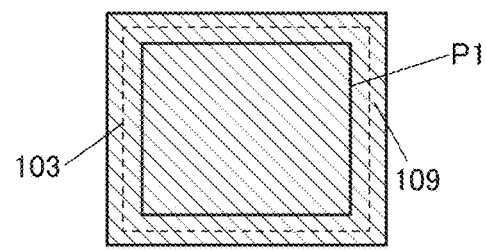
FIG. 1C1
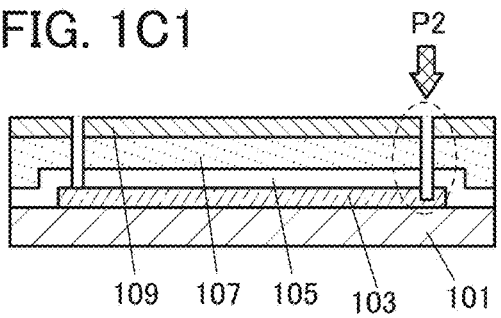
FIG. 1C2
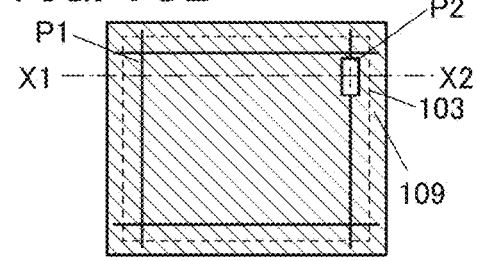
FIG. 1C3
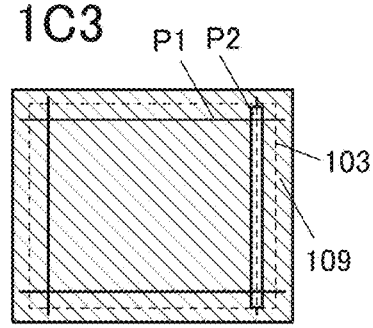
FIG. 1C4
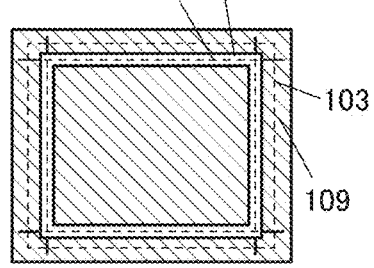

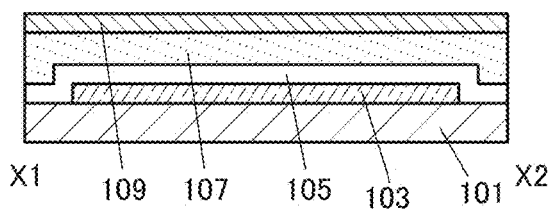
FIG. 2A1
FIG. 2A2
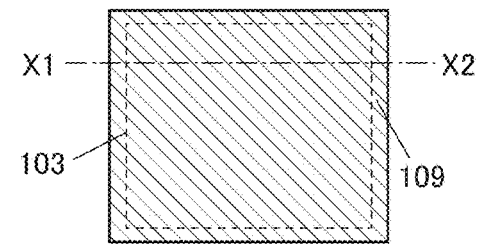
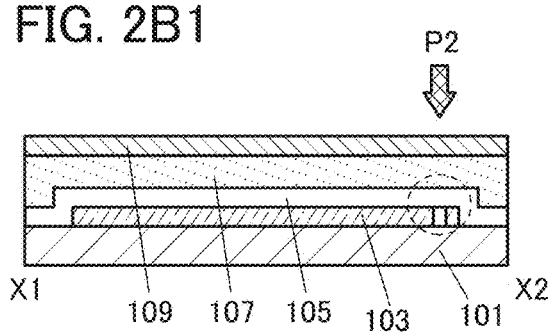
FIG. 2B1
FIG. 2B2
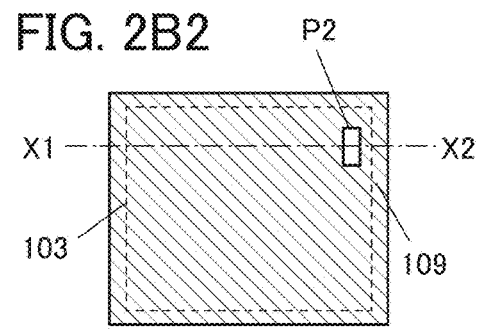
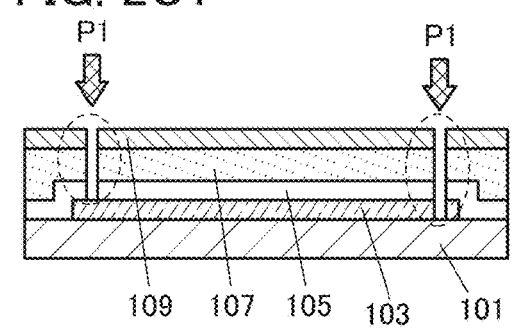
FIG. 2C1
FIG. 2C2
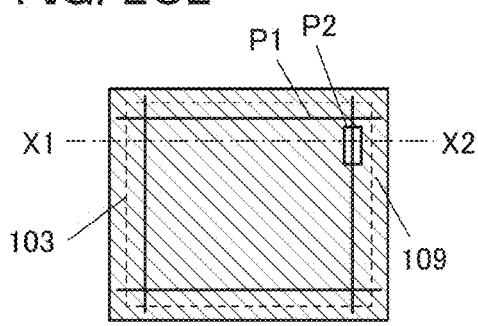
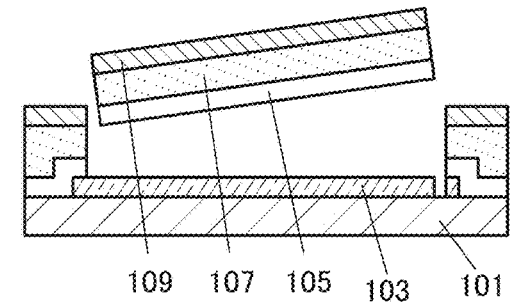
FIG. 2D FIG. 3A  FIG. 3B  FIG. 3C  FIG. 3D
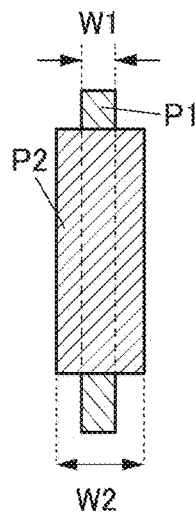 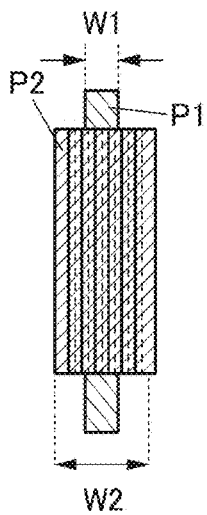 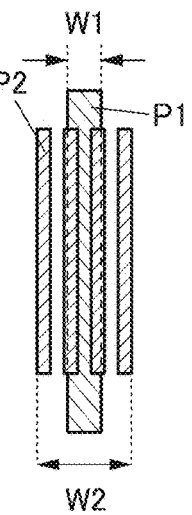 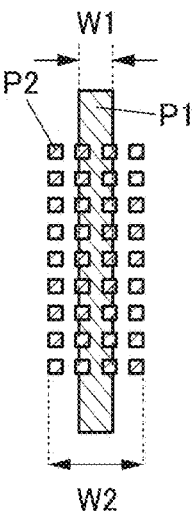
FIG. 3E
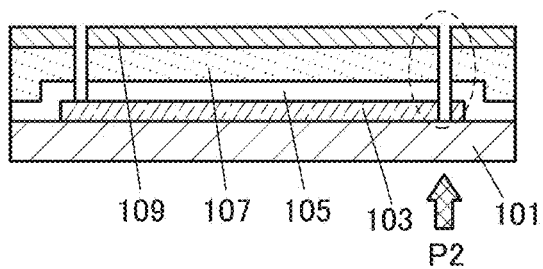
FIG. 3F1
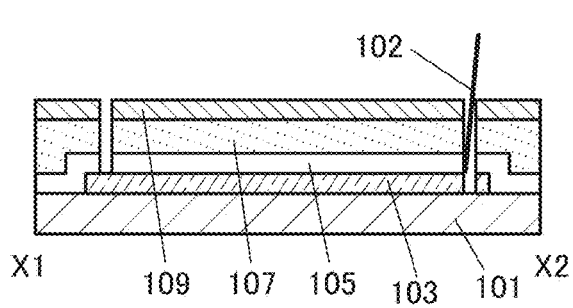
FIG. 3F2
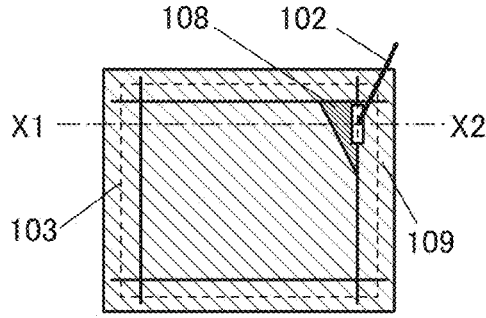

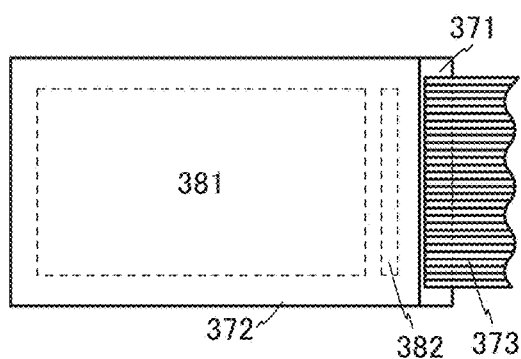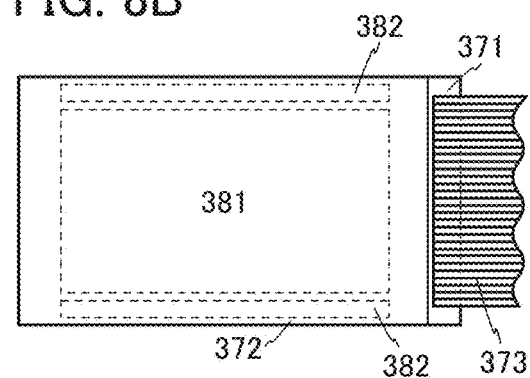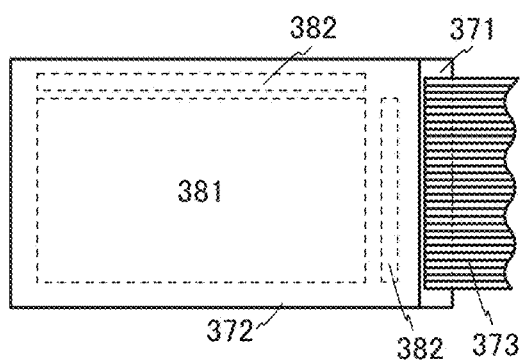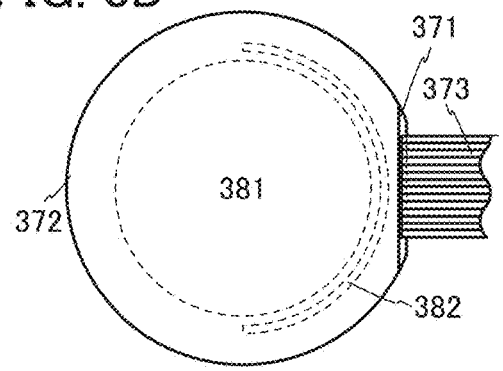

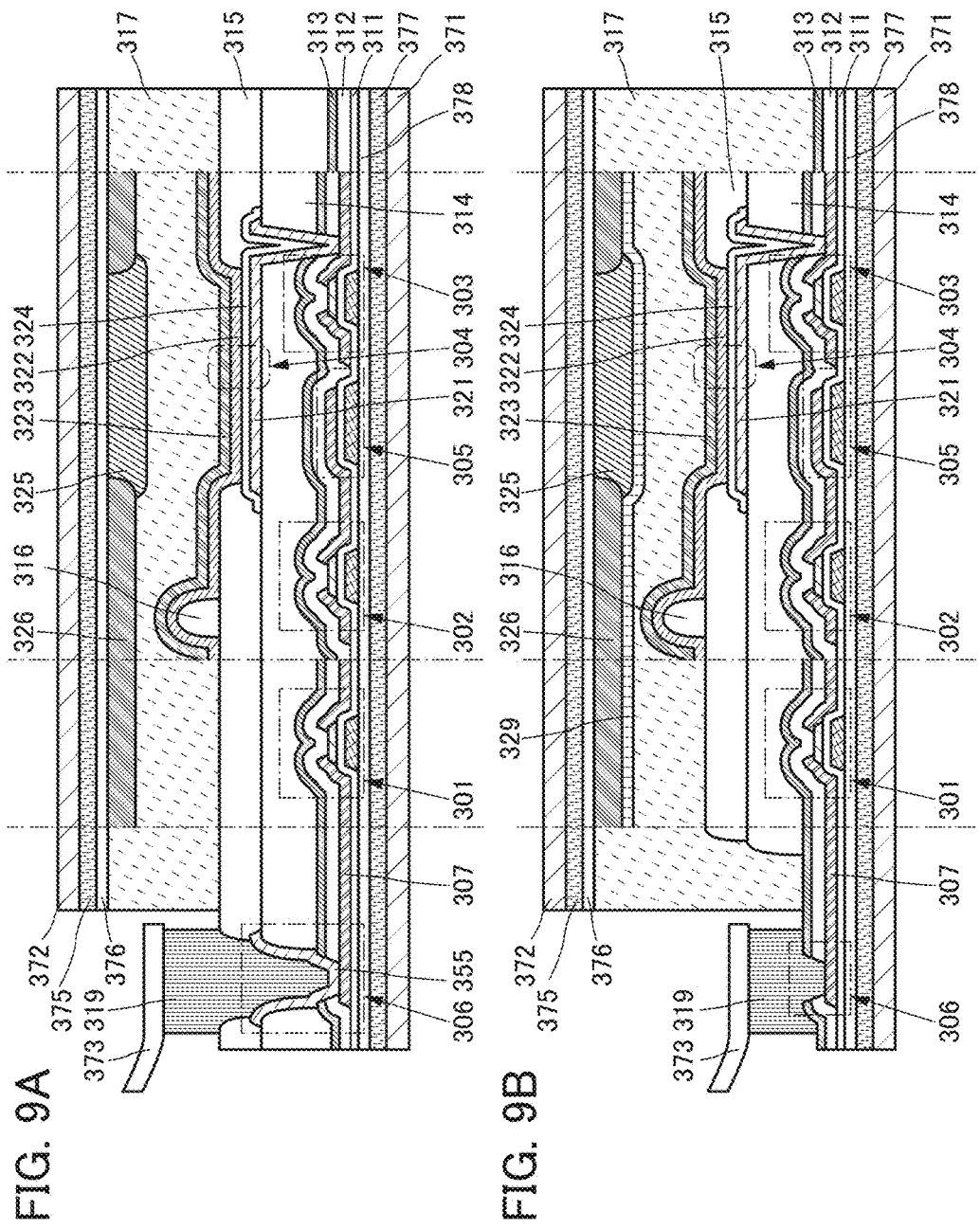

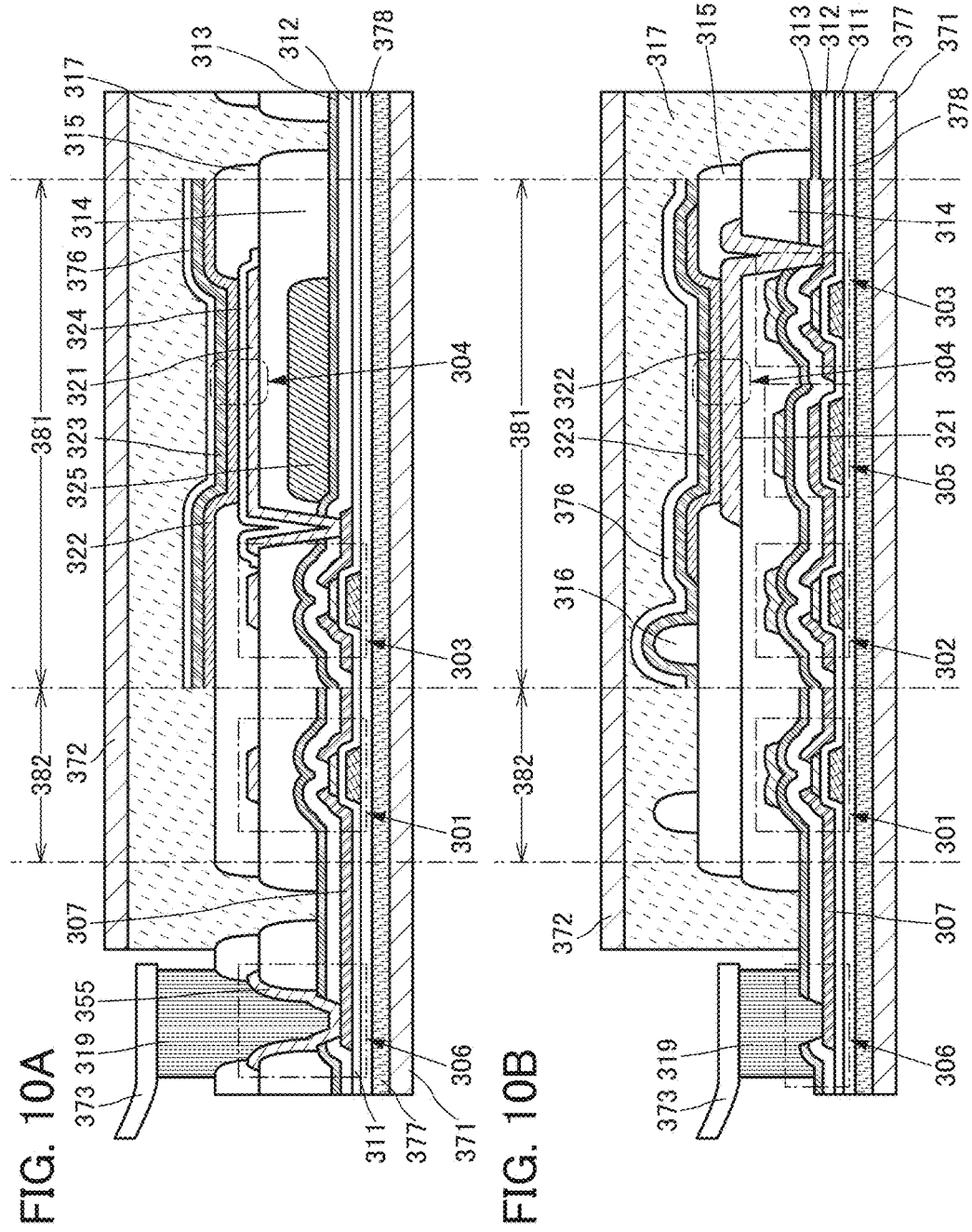

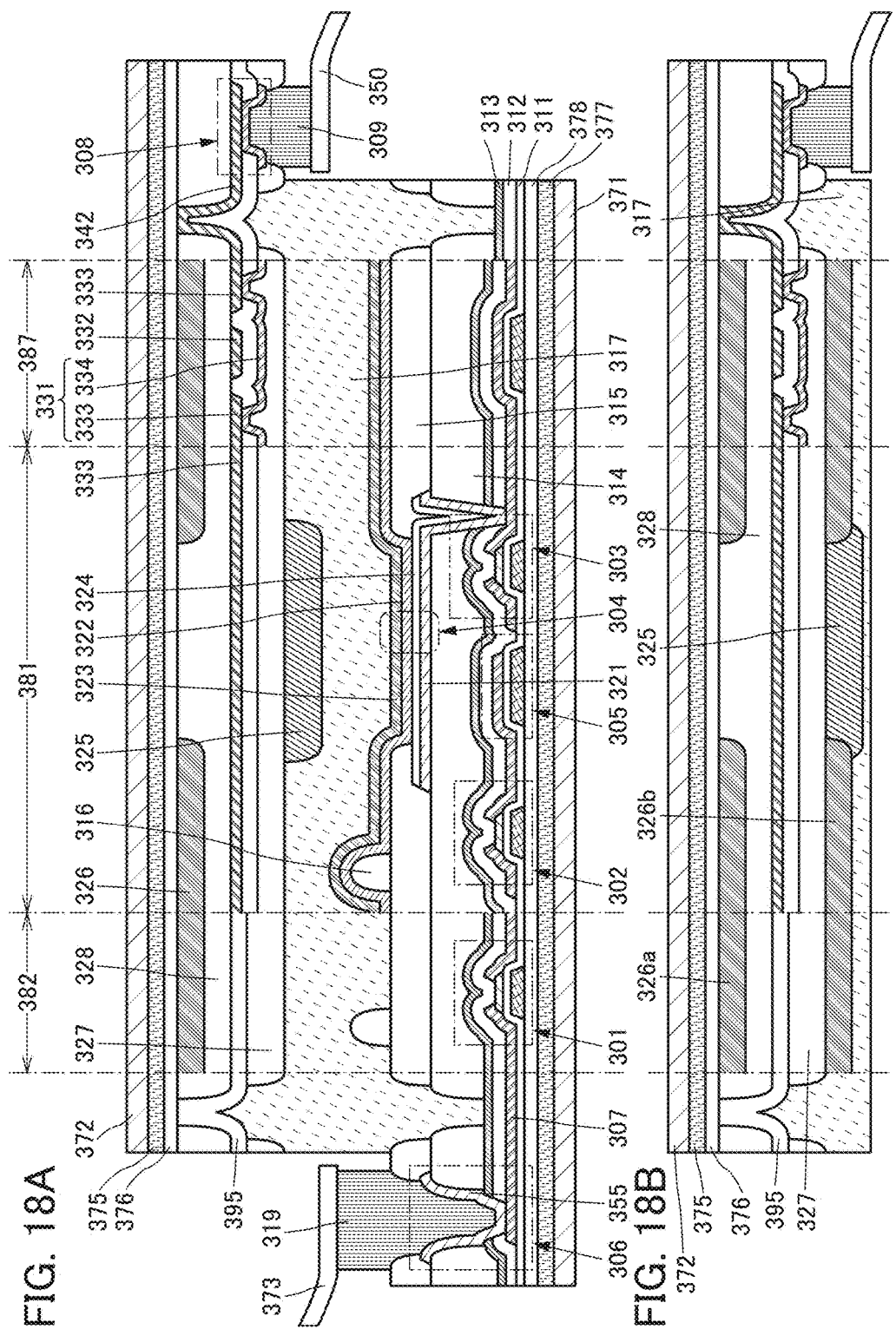

FIG. 19A
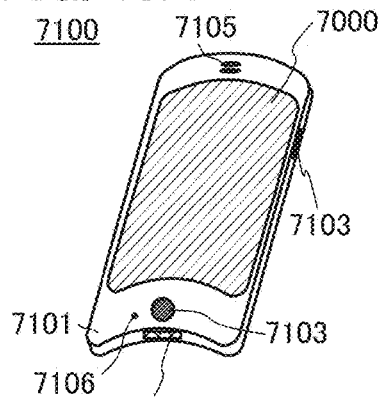
FIG. 19B
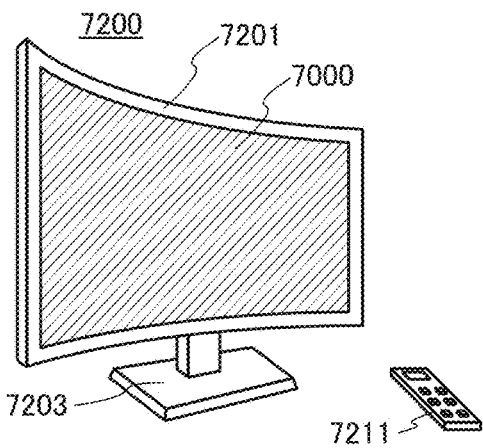
FIG. 19C1
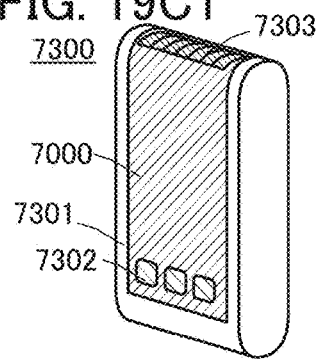
FIG. 19D
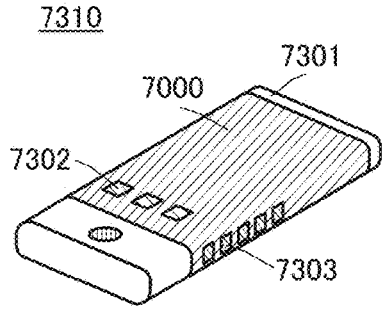
FIG. 19E
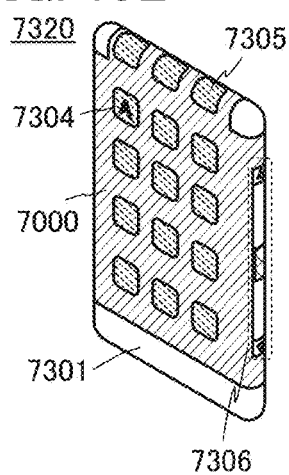
FIG. 19C2
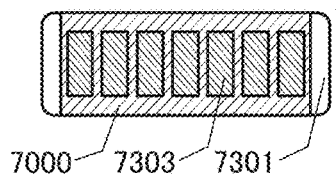
FIG. 19F
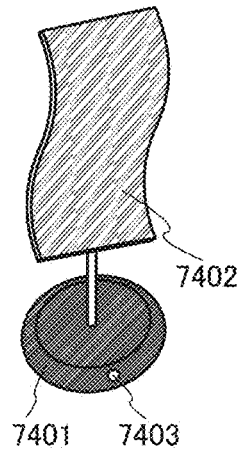
FIG. 19G
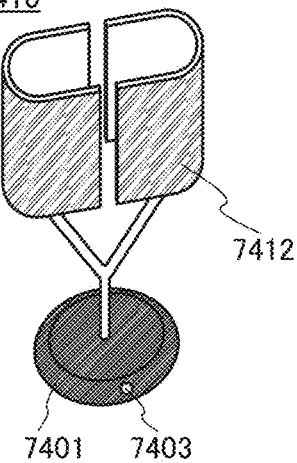
FIG. 19H
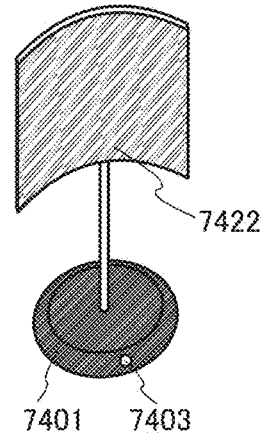

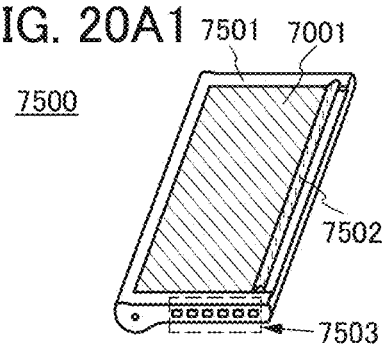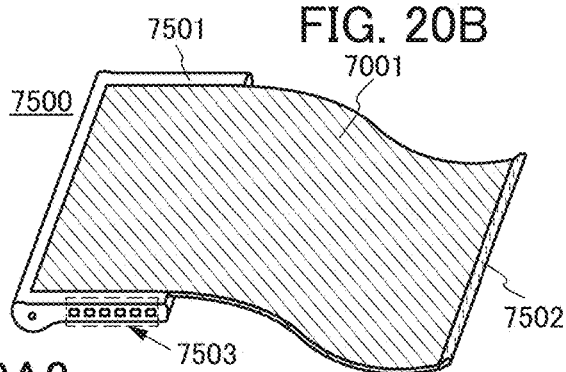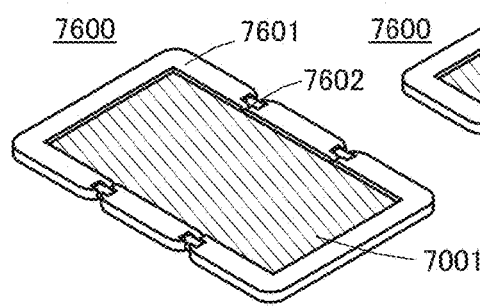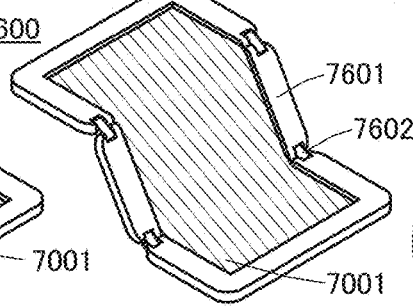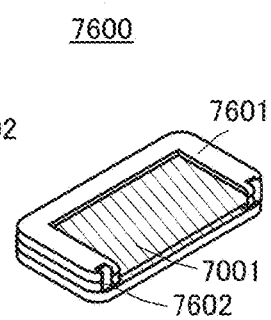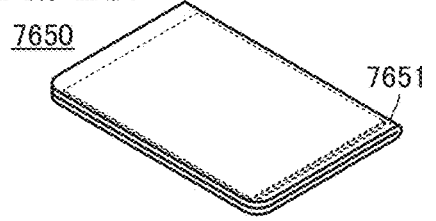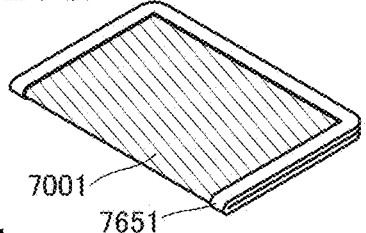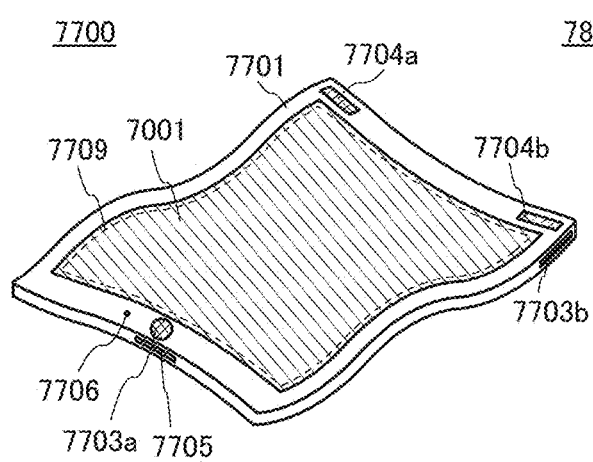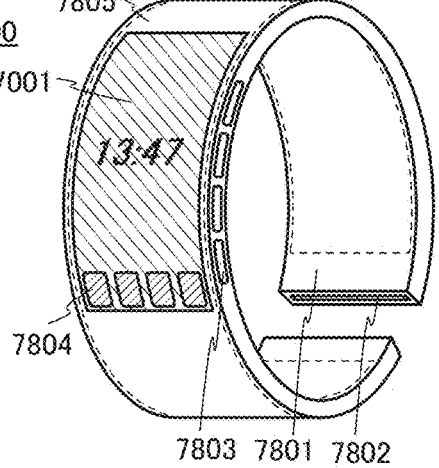

METHOD FOR FORMING SEPARATION STARTING POINT AND SEPARATION METHOD

BACKGROUND OF THE INVENTION

1. Field of the Invention

One embodiment of the present invention relates to a method for forming a separation starting point and a separation method.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a method for driving any of them, and a method for manufacturing any of them.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device including a flexible substrate, a technique has been developed in which a functional element such as a thin film transistor or an electroluminescence (EL) element is formed over a formation substrate (e.g., a glass substrate or a quartz substrate), and then the functional element is transferred to a flexible substrate. This technique needs a step of separating a layer to be separated including the functional element from the formation substrate (referred to as a separation step).

For example, Patent Document 1 discloses the following separation technique using laser ablation: a separation layer formed of amorphous silicon or the like is provided over a substrate, a layer to be separated that includes a thin film element is provided over the separation layer, and the layer to be separated is bonded to a transfer body with the use of an adhesive layer. The separation layer is ablated by laser irradiation, so that separation is generated in the separation layer.

In addition, Patent Document 2 discloses a technique in which separation is conducted by physical force with human hands or the like. Patent Document 2 discloses the following separation technique: a metal layer is formed between a substrate and an oxide layer, and separation is generated at an interface between the oxide layer and the metal layer by utilizing a weak bonding between the oxide layer and the metal layer, whereby a layer to be separated and the substrate are separated from each other.

REFERENCE

Patent Document

[Patent Document 1] Japanese Published Patent Application No. H10-125931
[Patent Document 2] Japanese Published Patent Application No. 2003-174153

SUMMARY OF THE INVENTION

When it is difficult to perform separation at a separation interface in a separation process, high stress is applied to a layer to be separated, so that a crack might be generated in a layer included in the layer to be separated and a functional element might be damaged.

An object of one embodiment of the present invention is to improve a yield in a separation process.

An object of one embodiment of the present invention is to improve the yield in a process for manufacturing a semiconductor device, a light-emitting device, a display device, an input/output device, an electronic device, a lighting device, or the like. In particular, an object of one embodiment of the present invention is to improve the yield in a process for manufacturing a lightweight, thin, or flexible device.

An object of one embodiment of the present invention is to provide a novel method for forming a separation starting point or a novel separation method. An object of one embodiment of the present invention is to provide a novel separation apparatus or a novel apparatus for manufacturing a process member.

Note that the descriptions of these objects do not disturb the existence of other objects. One embodiment of the present invention does not necessarily achieve all the objects. Other objects can be derived from the description of the specification, the drawings, and the claims.

A method for forming a separation starting point that is one embodiment of the present invention includes a first step of irradiating a first portion of a process member with first laser light in a frame-like shape, and a second step of irradiating at least part of a region which is irradiated with the first laser light with second laser light. The process member includes a first substrate, a separation layer, a layer to be separated, and an adhesive layer which are stacked in this order. In the first portion, the adhesive layer overlaps with the first substrate with the separation layer and the layer to be separated provided therebetween. In the first step, the first laser light is absorbed by at least the layer to be separated and the adhesive layer. In the second step, the second laser light is absorbed by at least the separation layer. There is no particular limitation on the order of the first step and the second step.

The first laser light is preferably ultraviolet light or infrared light. Alternatively, the first laser light is preferably light having a shorter wavelength than ultraviolet light or light having a longer wavelength than visible light. The second laser light is preferably visible light. Alternatively, the second laser light is preferably light having a longer wavelength than visible light.

In the first step, the layer to be separated and the adhesive layer are preferably cut. In the first step, it is preferable that the separation layer be also cut.

In the second step, at least part of the separation layer is preferably separated from the layer to be separated. Alternatively, in the second step, the separation layer is preferably cut.

The irradiation with the first laser light and the second laser light is preferably performed from the adhesive layer side to the first substrate side.

The process member may further include a second substrate. In this case, the second substrate and the layer to be separated are attached to each other with the adhesive layer. In the first step, the first laser light is absorbed by at least the second substrate, the layer to be separated, and the adhesive layer.

A separation method of one embodiment of the present invention includes the steps of forming the separation layer over the first substrate, forming the layer to be separated over and in contact with the separation layer, forming the adhesive layer over the separation layer and the layer to be separated and curing the adhesive layer, forming a separation starting point by the above-described method for forming a separation starting point, separating the layer to be separated from the separation layer from the separation starting point.

One embodiment of the present invention is a method for manufacturing a semiconductor device, a light-emitting device, a display device, an electronic device, or a lighting device using any of the above-described separation methods.

According to one embodiment of the present invention, a yield in a separation process is improved.

According to one embodiment of the present invention, the yield in a process for manufacturing a semiconductor device, a light-emitting device, a display device, an input/output device, an electronic device, a lighting device, or the like is improved. In particular, the yield in a process for manufacturing a lightweight, thin, or flexible device is improved.

According to one embodiment of the present invention, a novel method for forming a separation starting point or a novel separation method is provided. According to one embodiment of the present invention, a novel separation apparatus or a novel apparatus for manufacturing a process member is provided.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF THE DRAWINGS

In the accompanying drawings:

FIGS. 1A1, 1B1, and 1C1 are cross-sectional views illustrating an example of a method for forming a separation starting point and FIGS. 1A2, 1B2, 1B3, 1C2, 1C3, and 1C4 are top views illustrating the same;

FIGS. 2A1, 2B1, 2C1, and 2D are cross-sectional views illustrating an example of a method for forming a separation starting point and FIGS. 2A2, 2B2, and 2C2 are top views illustrating the same;

FIGS. 3A, 3B, 3C, 3D, and 3F2 are top views illustrating an example of a method for forming a separation starting point and FIGS. 3E and 3F1 are cross-sectional views illustrating the same;

FIGS. 8A to 8D are top views each illustrating an example of a light-emitting panel;

FIGS. 9A and 9B are cross-sectional views each illustrating an example of a light-emitting panel;

FIGS. 10A and 10B are cross-sectional views each illustrating an example of a light-emitting panel;

FIGS. 18A and 18B are cross-sectional views each illustrating an example of a touch panel;

FIGS. 19A, 19B, 19C1, 19C2, 19D, 19E, 19F, 19G, and 19H illustrate examples of electronic devices and lighting devices;

FIGS. 20A1, 20A2, 20B, 20C, 20D, 20E, 20F, 20G, 20H, and 20I illustrate examples of electronic devices;

DETAILED DESCRIPTION OF THE INVENTION

Figure 4A:
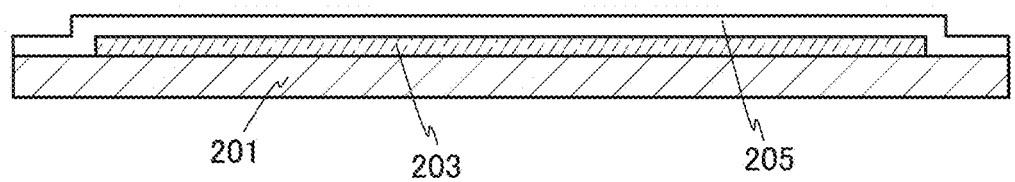
FIGS. 4A to 4C are cross-sectional views illustrating an example of a separation method.

Embodiments will be described in detail with reference to the drawings. Note that the present invention is not limited to the description below, and it is easily understood by those skilled in the art that various changes and modifications can be made without departing from the spirit and scope of the present invention. Thus, the present invention should not be construed as being limited to the description in the following embodiments and example.

Note that in the structures of the invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

In addition, the position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film", and the term "insulating film" can be changed into the term "insulating layer".

Note that in this specification, a "substrate" preferably has a function of supporting at least one of a functional circuit, a functional element, a functional film, and the like. A "substrate" does not necessary have a function of supporting a functional circuit, a functional element, a functional film, and the like, and may have a function of protecting a surface of the device, or a function of sealing at least one of a functional circuit, a functional element, a functional film, and the like, for example.

(Embodiment 1)

In this embodiment, a method for forming a separation starting point, a separation method, and a separation apparatus of one embodiment of the present invention are described with reference to FIGS. 1A1, 1A2, 1B1, 1B2, 1B3, 1C1, 1C2, 1C3, and 1C4, FIGS. 2A1, 2A2, 2B1, 2B2, 2C1, 2C2, and 2D, FIGS. 3A, 3B, 3C, 3D, 3E, 3F1, and 3F2, FIGS. 4A to 4C, FIGS. 5A to 5C, FIGS. 6A to 6D, and FIG. 7.

A layer to be separated can be formed over a formation substrate, separated from the formation substrate, and then transferred to another substrate. With this method, for example, a layer to be separated which is formed over a formation substrate having high heat resistance can be transferred to a substrate having low heat resistance, and the manufacturing temperature of the layer to be separated is not limited by the substrate having low heat resistance. The layer to be separated is transferred to a substrate or the like which is more lightweight, thin, or flexible than the formation substrate, whereby a variety of devices such as a semiconductor device, a light-emitting device, and a display device can be made more lightweight, thin, and flexible.

A device that can be manufactured according to one embodiment of the present invention includes a functional element. Examples of the functional element include semiconductor elements such as a transistor; light-emitting elements such as an inorganic EL element, an organic EL element, and a light-emitting diode (LED); and display elements such as a liquid crystal element, an electrophoretic element, and a display element including micro electromechanical systems (MEMS). For example, a semiconductor device including a transistor and a light-emitting device including a light-emitting element (here, a display device including a transistor and a light-emitting element is also included) are examples of the device that can be manufactured according to one embodiment of the present invention.

One embodiment of the present invention relates to a method for forming a separation starting point. The separation starting point is formed before a separation process, whereby the yield of a separation process can be increased.
<Method for Forming Separation Starting Point>

FIGS. 1A1, 1B1, and 1C1 are cross-sectional views of a process member, and FIGS. 1A2, 1B2, and 1C2 are top views of the process member. FIGS. 1A1, 1B1, and 1C1 are cross-sectional views taken along the dashed-dotted lines X1-X2 in FIGS. 1A2, 1B2, and 1C2, respectively.

The process member includes a formation substrate 101, a separation layer 103, a layer to be separated 105, an adhesive layer 107, and a substrate 109. The separation layer 103 having an island shape is provided over the formation substrate 101. The layer to be separated 105 is provided over the formation substrate 101 and the separation layer 103. The layer to be separated 105 is in contact with the separation layer 103. The adhesive layer 107 is provided over the layer to be separated 105. The process member includes a first portion where the adhesive layer 107 overlaps with the formation substrate 101 with the separation layer 103 positioned therebetween, and a second portion where the separation layer 103 is not provided between the adhesive layer 107 and the formation substrate 101 which overlap with each other. The substrate 109 is attached to the layer to be separated 105 with the adhesive layer 107.

In the following example of a method for forming a separation starting point, the case where the formation substrate 101 and the layer to be separated 105 are separated from each other is described.

First, as illustrated in FIGS. 1B1 and 1B2, the process member is irradiated with first laser light P1.

As illustrated in FIG. 1B1, the irradiation with the first laser light P1 is performed from the substrate 109 side to the formation substrate 101 side.

As illustrated in FIG. 1B2, the first portion of the process member is irradiated with the first laser light P1 in a frame-like shape (or closed curve). For example, a polygonal frame-like shape, a circular frame-like shape, and an elliptical frame-like shape can be given.

FIG. 1B2 illustrates an example in which the inner side of an end portion of the separation layer 103 is irradiated with the first laser light P1 in a quadrangular frame-like shape.

The irradiation with the first laser light P1 may be performed once or a plurality of times. The same portion may be irradiated with the first laser light P1 more than once.

For example, the irradiation with the first laser light P1 can be performed along the four sides of the formation substrate 101. FIG. 1B2 illustrates an example in which a start position and an end position of the laser irradiation on one side do not overlap with those on the other sides. FIG. 1B3 illustrates an example in which a start position and an end position of the laser irradiation on one side overlap with those on the other sides.

As illustrated in FIG. 1B1, a portion where the adhesive layer 107 overlaps with the formation substrate 101 with the separation layer 103 and the layer to be separated 105 positioned therebetween is irradiated with the first laser light P1. The first laser light P1 is absorbed by at least the layer to be separated 105, the adhesive layer 107, and the substrate 109. The irradiation with the first laser light P1 enables part of the films included in the layer to be separated 105, the adhesive layer 107, and the substrate 109 to be dissolved, evaporated, or thermally fractured.

It is preferable that the first laser light P1 be also absorbed by the separation layer 103. Thus, the separation layer 103 can be damaged.

In the second portion where the separation layer 103 is not provided between the adhesive layer 107 and the formation substrate 101 which overlap with each other, the adhesion between the components is higher than that in the first portion; thus, separation failure is likely to occur.

The layer to be separated 105, the adhesive layer 107, and the substrate 109 can be cut by being irradiated with the first laser light P1. When the first portion is irradiated with the first laser light P1 in a frame-like shape, the separation can be performed only on the first portion, leading to an improvement in the yield of the separation.

As the first laser light P1, for example, ultraviolet light or light having a shorter wavelength than ultraviolet light can be used. Specifically, a UV laser with a wavelength of 266 nm can be used.

As another example of the first laser light P1, light having a longer wavelength than visible light, such as infrared light, can be used. Specifically, a carbon dioxide laser (a $CO_2$ laser) can be used.

There is no particular limitation on a laser used in one embodiment of the present invention. For example, a continuous wave laser or a pulsed oscillation laser can be used. Note that a condition for laser light irradiation such as frequency, power density, energy density, or beam profile is controlled as appropriate in consideration of thicknesses, materials, or the like of layers included in the process member.

The laser irradiation can be performed while at least one of the laser light and the process member is moved. For example, the laser irradiation may be performed while at least one of an optical system (e.g., a mirror) and a stage is moved.

Next, as illustrated in FIGS. 1C1 and 1C2, the process member is irradiated with second laser light P2.

As illustrated in FIG. 1C1, the irradiation with the second laser light P2 is preferably performed from the substrate 109 side to the formation substrate 101 side. It is preferable that the first laser light P1 and the second laser light P2 be delivered from the same surface side of the process member because the process member can be easily transferred and therefore a process and a manufacturing apparatus can be simplified.

The first portion of the process member is irradiated with the second laser light P2. As illustrated in FIG. 1C2, a region which is irradiated with the second laser light P2 overlaps with at least part of a region which is irradiated with the first laser light P1. A region which is irradiated with both the first laser light P1 and the second laser light P2 is favorably used as a separation starting position.

FIG. 1C2 illustrates an example in which part of a side of a quadrangular frame which is irradiated with the first laser light P1 is irradiated with the second laser light P2.

As illustrated in FIG. 1C3, the region which is irradiated with the second laser light P2 may include a corner portion of the quadrangular frame which is irradiated with the first laser light P1.

As illustrated in FIG. 1C4, the region which is irradiated with the first laser light P1 may be irradiated with the second laser light P2 in a frame-like shape.

The irradiation with the second laser light P2 may be performed once or a plurality of times. The same portion may be irradiated with the second laser light P2 more than once.

As illustrated in FIG. 1C1, a portion where the separation layer 103 overlaps with the formation substrate 101 is irradiated with the second laser light P2. The second laser light P2 is absorbed by at least the separation layer 103. The irradiation with the second laser light P2 enables part of the separation layer 103 to be dissolved, evaporated, or thermally fractured.

The separation layer 103 can be damaged by being irradiated with the second laser light P2. By this step, at least part of the separation layer 103 is preferably separated from the layer to be separated 105. Alternatively, at least part of the separation layer 103 may be removed or the separation layer 103 may be cut. The second laser light P2 preferably passes through the layer to be separated 105, the adhesive layer 107, and the substrate 109. Alternatively, the second laser light P2 may be absorbed by one or more of the layer to be separated 105, the adhesive layer 107, and the substrate 109.

As the second laser light P2, for example, visible light or light having a longer wavelength than visible light can be used. Specifically, a green laser with a wavelength of 532 nm can be used.

Even in the case where the separation layer 103 can absorb the first laser light P1, it is difficult to form a separation starting point in the separation layer 103 only with the first laser light P1 in some cases. For example, in the case where ultraviolet light is used as the first laser light P1 and a glass substrate is used as the formation substrate 101, the ultraviolet light sufficient for forming a separation starting point is absorbed not only by the separation layer 103 but also by the glass substrate and therefore the glass substrate might be damaged or cut. This might cause problems such as difficulties in transferring the process member and reusing the glass substrate, and diffusion of a foreign substance generated from the glass substrate due to the cutting into the layer to be separated 105.

Furthermore, the force required for the separation depends on the structure of the process member. For example, in the case where the separation layer 103 has a stacked-layer structure including a layer containing tungsten and a layer containing an oxide of tungsten, the force required for the separation increases as the thickness of the layer containing an oxide of tungsten decreases. Thus, the yield of the separation using the separation starting point formed only with the first laser light P1 might be low depending on the structure of the process member.

In one embodiment of the present invention, a separation starting point is formed using both a laser which can cut the layer to be separated 105, the adhesive layer 107, and the substrate 109 by being absorbed therein, and a laser which can cut the separation layer 103 by being absorbed therein. Accordingly, a separation starting point that enables the separation to be performed more surely can be formed, leading to an improvement in the yield of the separation.

In one embodiment of the present invention, there is no limitation on the irradiation order of the two lasers. An example in which the irradiation with the first laser light P1 is performed after the irradiation with the second laser light P2 is described below. Furthermore, the irradiation with one of the two lasers may be repeated after the irradiation with the other laser.

FIGS. 2A1, 2B1, and 2C1 are cross-sectional views of the process member, and FIGS. 2A2, 2B2, and 2C2 are top views of the process member. FIGS. 2A1, 2B1, and 2C1 are cross-sectional views taken along the dashed-dotted lines X1-X2 in FIGS. 2A2, 2B2, and 2C2, respectively.

The process member illustrated in FIGS. 2A1 and 2A2 has a structure similar to that of the process member illustrated in FIGS. 1A1 and 1A2.

First, as illustrated in FIGS. 2B1 and 2B2, the process member is irradiated with the second laser light P2.

The first portion of the process member is irradiated with the second laser light P2. FIG. 2B2 illustrates an example in which the inner side of the end portion of the separation layer 103 is partly irradiated with the second laser light P2.

As illustrated in FIG. 2B1, a portion where the adhesive layer 107 overlaps with the formation substrate 101 with the separation layer 103 and the layer to be separated 105 positioned therebetween is irradiated with the second laser light P2. The second laser light P2 is absorbed by at least the separation layer 103. The irradiation with the second laser light P2 enables part of the separation layer 103 to be dissolved, evaporated, or thermally fractured. FIG. 2B1 illustrates an example in which the second laser light P2 passes through the layer to be separated 105, the adhesive layer 107, and the substrate 109.

The separation layer 103 can be damaged by being irradiated with the second laser light P2.

Next, as illustrated in FIGS. 2C1 and 2C2, the process member is irradiated with the first laser light P1.

The region which is irradiated with the first laser light P1 overlaps with at least part of the region which is irradiated with the second laser light P2. The first portion of the process member is irradiated with the first laser light P1 in a frame-like shape.

As illustrated in FIG. 2C1, a portion where the adhesive layer 107 overlaps with the formation substrate 101 with the separation layer 103 and the layer to be separated 105 positioned therebetween is irradiated with the first laser light P1. The first laser light P1 is absorbed by at least the layer to be separated 105, the adhesive layer 107, and the substrate 109. In the case where the separation layer 103 remains in the region which is irradiated with the second laser light P2, the first laser light P1 is preferably absorbed by the separation layer 103. The irradiation with the first laser light P1 enables part of the films included in the layer to be separated 105, the adhesive layer 107, and the substrate 109 to be dissolved, evaporated, or thermally fractured.

The layer to be separated 105, the adhesive layer 107, and the substrate 109 can be cut by being irradiated with the first laser light P1. When the first portion is irradiated with the first laser light P1 in a frame-like shape, the separation can be performed only on the first portion, leading to an improvement in the yield of the separation.

FIG. 2D illustrates an example in which the process member including a separation starting point formed by a method for forming a separation starting point that is one embodiment of the present invention is separated.

A frame-like cut is made in the first portion of the process member by the irradiation with the first laser light P1 in a frame-like shape. A portion that is positioned inside the cut lines when the process member is seen from above is separated from the formation substrate 101.

FIGS. 3A to 3C are enlarged views of a portion where the region which is irradiated with the first laser light P1 and the region which is irradiated with the second laser light P2 overlap with each other.

The second laser light P2 preferably has a sufficient width so that the portion where the region which is irradiated with the first laser light P1 and the region which is irradiated with the second laser light P2 overlap with each other is surely formed.

In FIGS. 3A to 3C, a width W2 of the region which is irradiated with the second laser light P2 is preferably larger than a width W1 of the region which is irradiated with the first laser light P1. In the case where a functional element included in the layer to be separated should not be irradiated with laser light, the laser light is delivered so as not to overlap with a region in which the functional element is formed. For example, when a display panel is manufactured, the laser light irradiation is preferably performed outside a display region.

As illustrated in FIGS. 3B and 3C, the irradiation with the second laser light P2 may be performed in a plurality of linear shapes. FIG. 3B illustrates an example in which a pitch between the plurality of linear shapes is narrower than the width of the second laser light P2. FIG. 3C illustrates an example in which the pitch between the plurality of linear shapes is wider than the width of the second laser light P2. The case of FIG. 3B is preferable to the case of FIG. 3C because the force required for the separation can be reduced. Alternatively, as illustrated in FIG. 3D, the irradiation with the second laser light P2 may be performed in a plurality of dotted shapes (in a matrix) spaced from each other. In the case where the laser light irradiation is performed in a plurality of dotted shapes with a narrow pitch, the force required for the separation can also be reduced.

Furthermore, as illustrated in FIG. 3E, the irradiation with the second laser light P2 may be performed from the formation substrate 101 side to the substrate 109 side. In this case, the second laser light P2 passes through the formation substrate 101. Accordingly, part of the separation layer 103 can be removed without damage to the formation substrate 101.

Note that the force required for the separation might be increased when residues of the substrate 109, the adhesive layer 107, and the like which are dissolved by the laser light are attached to the formation substrate 101 or the side surface of the process member exposed in the cut. In order to perform the separation more surely, a needle 102 is preferably inserted into a portion which is irradiated with both the first laser light P1 and the second laser light P2 (see FIGS. 3F1 and 3F2). By this step, an unnecessary welded portion, which hinders the separation, can be removed. In addition, the needle 102 may be used to start the separation from a separation starting point. As the needle 102, a rigid protrusion can be used. Alternatively, a sharp cutting tool such as a cutter may be used.

By being irradiated with at least one of the first laser light P1 and the second laser light P2, the layer to be separated 105 is partly separated from the separation layer 103 and lifting of a film can be visually recognized in some cases. Specifically, the lifted portion can be recognized because it exhibits different color from the other portions. When the needle 102 is inserted, and further, the needle 102 is used to perform the separation, a region 108 where the film is lifted up can be expanded (see FIG. 3F2).

<Structure Example of Process Member>

Examples of materials that can be used for the process member are described below.

The process member is manufactured using a material selected such that separation occurs at the interface between the formation substrate and the separation layer, the interface between the separation layer and the layer to be separated, or in the separation layer when the layer to be separated is separated from the formation substrate. In this embodiment, an example in which separation occurs at the interface between the separation layer and the layer to be separated is described; however, one embodiment of the present invention is not limited to such an example and depends on materials used for the separation layer and the layer to be separated.

There is no particular limitation on the formation substrate as long as the formation substrate has heat resistance high enough to withstand a manufacturing process and a thickness and a size which can be used in a manufacturing apparatus.

Examples of materials that can be used for the formation substrate include glass, ceramics, a metal, an inorganic material, and a resin.

Examples of the glass include non-alkali glass, soda-lime glass, potash glass, and crystal glass. Examples of the metal include stainless steel (SUS) and aluminum.

The formation substrate may have a single-layer structure, a stacked-layer structure, or the like. For example, a stacked-layer structure including a base and an insulating layer that prevents diffusion of impurities contained in the base may be employed. Specifically, a structure can be employed in which glass and various base layers that prevent diffusion of impurities contained in the glass, such as a silicon oxide layer, a silicon nitride layer, and a silicon oxynitride layer, are stacked.

Examples of materials that can be used for the separation layer include an inorganic material and an organic material.

Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon.

Examples of the organic material include polyimide, polyester, polyolefin, polyamide, polycarbonate, and an acrylic resin.

The separation layer may have a single-layer structure, a stacked-layer structure, or the like. For example, a stacked-layer structure including a layer containing tungsten and a layer containing an oxide of tungsten can be employed.

The layer containing an oxide of tungsten may be formed by stacking another layer with a layer containing tungsten, for example, the layer containing an oxide of tungsten may be formed by stacking a film containing oxygen, such as a silicon oxide film or a silicon oxynitride film, with a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

The layer containing an oxide of tungsten is preferably formed by performing plasma treatment on a surface of the layer containing tungsten in an atmosphere containing nitrous oxide and silane. By this method, a very thin layer containing an oxide of tungsten can be formed. Note that a silane-based gas other than silane may be used.

When the layer containing an oxide of tungsten is very thin, the layer containing an oxide of tungsten can be prevented from remaining on the layer to be separated after the formation substrate and the layer to be separated are separated from each other. Thus, a decrease in light extraction efficiency or generation of parasitic capacitance can be suppressed. The layer containing an oxide of tungsten can be formed thin such that the cross section thereof can hardly be observed with an electron microscope or the like. The layer containing an oxide of tungsten can be observed by an analysis using X-ray photoelectron spectroscopy (XPS) or the like.

As described above, even in the case where the layer containing an oxide of tungsten is very thin, the separation can be performed with a high yield by the method for forming a separation starting point that is one embodiment of the present invention.

Examples of materials that can be used for the layer to be separated include an inorganic material and an organic material.

The layer to be separated may have a single-layer structure, a stacked-layer structure, or the like. For example, a structure may be employed in which a functional layer overlapping with the separation layer and an insulating layer that is provided between the separation layer and the functional layer to prevent diffusion of impurities which impair the characteristics of the functional layer are stacked. Specifically, a structure can be employed in which a silicon oxynitride layer, a silicon nitride layer, and the functional layer are stacked in this order over the separation layer.

Examples of the functional layer include a functional circuit, a functional element, and a functional film. Specific examples include a pixel circuit of a display device, a driver circuit of a display device, a display element, a light-emitting element, a color filter, and a moisture-proof film.

Examples of materials that can be used for the adhesive layer include an inorganic material and an organic material.

Examples of an adhesive that can be used for the adhesive layer 107 include a photocurable adhesive such as an ultraviolet curable adhesive or a visible light curable adhesive, a reactive curable adhesive, a thermosetting adhesive, an anaerobic adhesive, and a two-component adhesive.

Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

The adhesive may be in a sheet form or a liquid form.

There is no particular limitation on the substrate 109 as long as the substrate 109 has heat resistance high enough to withstand a manufacturing process and a thickness and a size which can be used in a manufacturing apparatus.

A material similar to that of the formation substrate, for example, can be used for the substrate 109.

For the substrate 109, a resin is preferably used. Examples of materials that can be used for the substrate 109 include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

<Separation Method>

Next, a method for separating the layer to be separated from a process member having a different structure from the above-described process member by the method for forming a separation starting point that is one embodiment of the present invention is described.

As illustrated in FIG. 4A, a separation layer 203 is formed over a formation substrate 201, and a layer to be separated 205 is formed over the separation layer 203. The separation layer 203 having an island shape is provided over the formation substrate 201. The layer to be separated 205 is provided over the formation substrate 201 and the separation layer 203. The layer to be separated 205 is in contact with the separation layer 203.

Figure 4B:
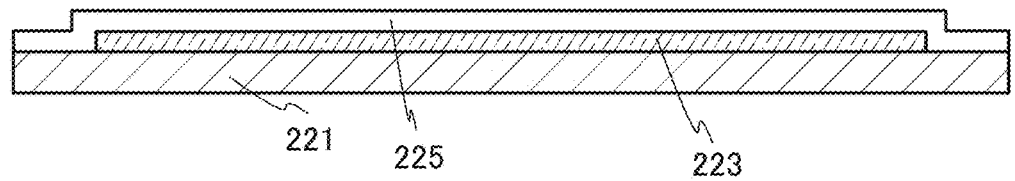

In addition, as illustrated in FIG. 4B, a separation layer 223 is formed over a formation substrate 221, and a layer to be separated 225 is formed over the separation layer 223. The separation layer 223 having an island shape is provided over the formation substrate 221. The layer to be separated 225 is provided over the formation substrate 221 and the separation layer 223. The layer to be separated 225 is in contact with the separation layer 223.

Figure 4C:
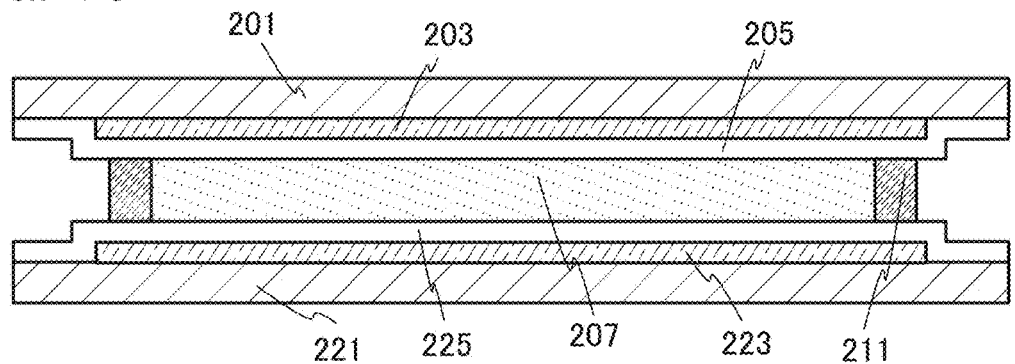

Next, as illustrated in FIG. 4C, the formation substrate 201 and the formation substrate 221 are attached to each other with an adhesive layer 207 so that surfaces on which the layers to be separated are formed face each other, and the adhesive layer 207 is cured. Here, a frame-like partition 211 and the adhesive layer 207 on the inner side of the partition 211 are provided over the layer to be separated 225 and then the formation substrate 201 and the formation substrate 221 face each other and are attached to each other. Note that the formation substrate 201 and the formation substrate 221 are preferably attached to each other in a reduced-pressure atmosphere.

Although the separation layer 203 and the separation layer 223 have the same size in FIG. 4C, the two separation layers may have different sizes.

The adhesive layer 207 is provided to overlap with the separation layer 203, the layer to be separated 205, the layer to be separated 225, and the separation layer 223. Then, an end portion of the adhesive layer 207 is preferably positioned on the inner side of at least an end portion of either the separation layer 203 or the separation layer 223 (the separation layer which is desirably separated first). Accordingly, strong adhesion between the formation substrate 201 and the formation substrate 221 can be suppressed; thus, a decrease in the yield of a subsequent separation process can be suppressed.

The frame-like partition 211 that surrounds the adhesive layer 207 is preferably formed. With the frame-like partition 211 surrounding the adhesive layer 207, the adhesive layer 207 can be blocked with the partition 211 even when it spreads.

The formation order of the partition 211 and the adhesive layer 207 is not limited. For example, the partition 211 may be formed by a coating method or the like after the adhesive layer 207 is formed by a screen printing method or the like. Alternatively, after the partition 211 is formed by a coating method or the like, the adhesive layer 207 may be formed using a device or the like employing a one drop fill (ODF) method.

The partition 211 may be in any of a cured state, a semi-cured state, and an uncured state as long as the adhesive layer 207 can be prevented from spreading outside of the separation layer. For the partition 211, a material similar to the material that can be used for the adhesive layer 207 can be used.

Figure 5A:
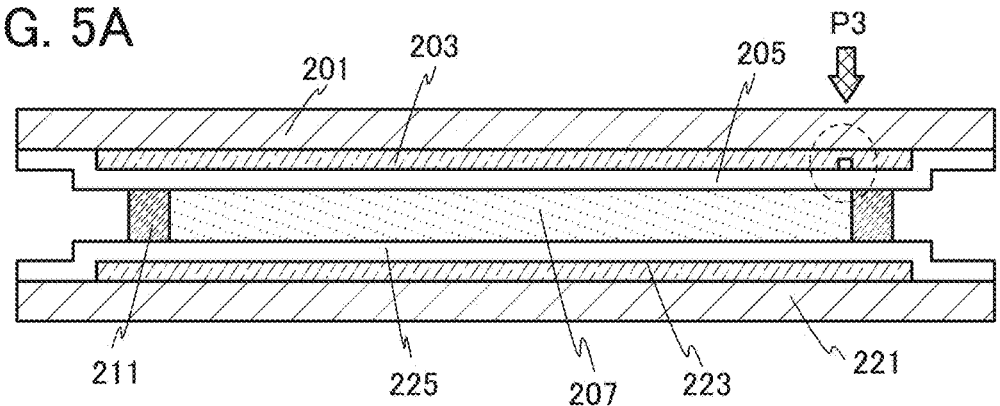
FIGS. 5A to 5C are cross-sectional views illustrating an example of a separation method.
Figure 5B:
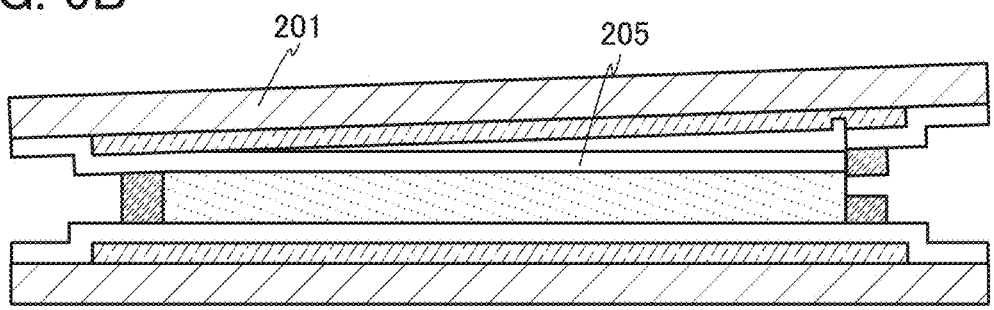

Next, a separation starting point is formed by laser light irradiation (FIGS. 5A and 5B).

Either the formation substrate 201 or the formation substrate 221 may be separated first. Here, an example in which the formation substrate 201 is separated first is described.

A region where the adhesive layer 207 in a cured state, the layer to be separated 205, and the separation layer 203 overlap with each other is irradiated with laser light (see an arrow P3 in FIG. 5A).

The separation layer 203 is partly separated from the layer to be separated 205, whereby the separation starting point can be formed. Furthermore, at least one of the separation layer 203 and the layer to be separated 205 may be partly removed to form the separation starting point. For example, in a region surrounded by the dashed line in FIG. 5A, the separation layer 203 is partly removed.

It is preferable that laser light irradiation be performed from the side of the substrate provided with the separation layer that is desirably separated. When a region where the separation layer 203 and the separation layer 223 overlap with each other is irradiated with laser light, the formation substrate 201 can be selectively separated by cracking only the separation layer 203 and not the separation layer 223 (see a region surrounded by the dashed line in FIG. 5A).

Figure 5C:
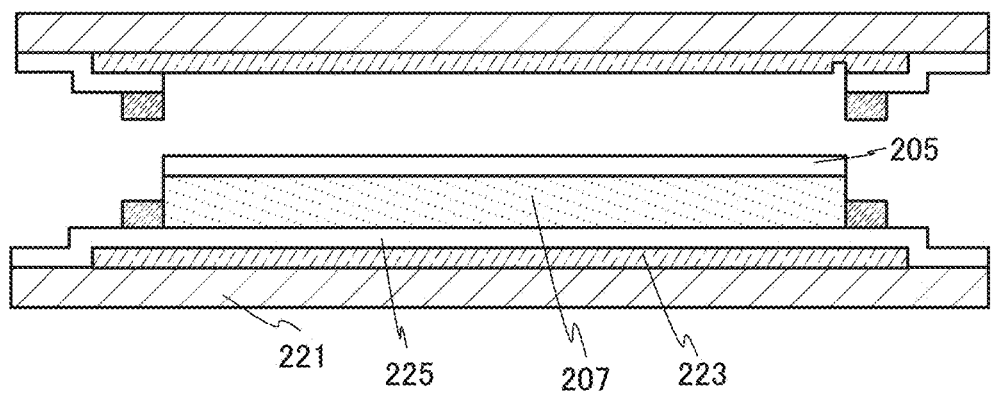

Then, the layer to be separated 205 and the formation substrate 201 are separated from each other from the formed separation starting point (FIGS. 5B and 5C). Thus, the layer to be separated 205 can be transferred from the formation substrate 201 to the formation substrate 221. At this time, one of the substrates is preferably fixed to a suction stage or the like.

For example, the layer to be separated 205 and the formation substrate 201 can be separated by mechanical force (e.g., a separation process with a human hand or a gripper, or a separation process by rotation of a roller) by utilizing the separation starting point.

The formation substrate 201 and the layer to be separated 205 may be separated by filling the interface between the separation layer 203 and the layer to be separated 205 with a liquid such as water. A portion between the separation layer 203 and the layer to be separated 205 absorbs a liquid through capillarity action, so that separation can be performed easily. Furthermore, an adverse effect of static electricity caused at separation on the functional element included in the layer to be separated 205 (e.g., damage to a semiconductor element from static electricity) can be suppressed.

Note that after the separation, the adhesive layer 207, the partition 211, and the like which do not contribute to attachment between the formation substrate 201 and the formation substrate 221 and which remain over the formation substrate 221 may be removed. Such removal is preferable because an adverse effect on the functional element in a subsequent step (e.g., entry of impurities) can be suppressed. For example, an unnecessary resin can be removed by wiping or cleaning.

Figure 6A:
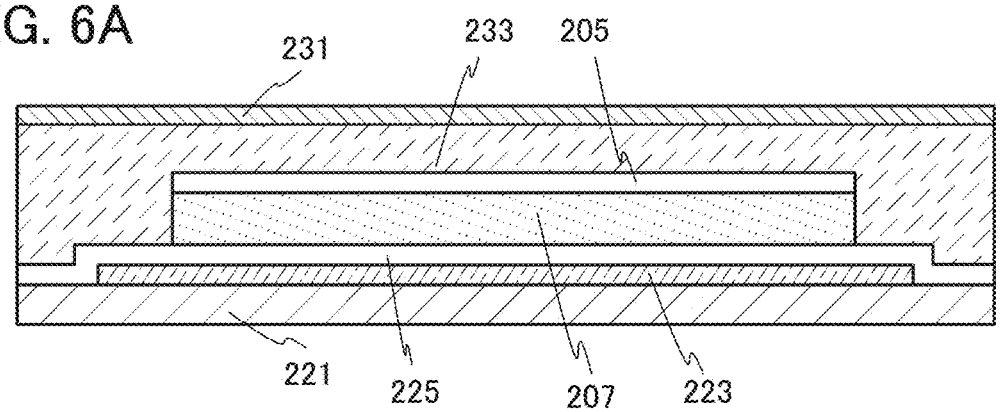
FIGS. 6A to 6D are cross-sectional views illustrating an example of a separation method.

Next, the exposed layer to be separated 205 is attached to a substrate 231 with an adhesive layer 233, and the adhesive layer 233 is cured (FIG. 6A).

Figure 6B:
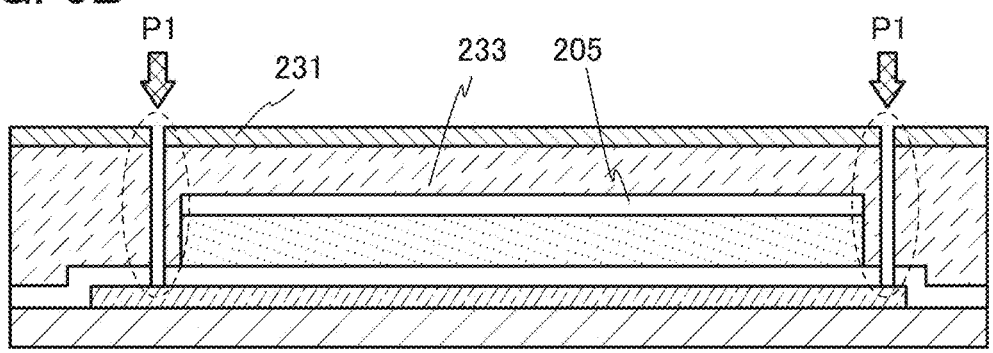

Next, the irradiation with the first laser light P1 is performed (FIG. 6B). The irradiation with the first laser light P1 is performed from the substrate 231 side to the formation substrate 221 side. A portion where the adhesive layer 233 overlaps with the formation substrate 221 with the separation layer 223 positioned therebetween is irradiated with the first laser light P1 in a frame-like shape.

The substrate 231, the adhesive layer 233, and the layer to be separated 225 are cut by being irradiated with the first laser light P1. In addition, part of the separation layer 223 may be removed or cut.

Figure 6C:
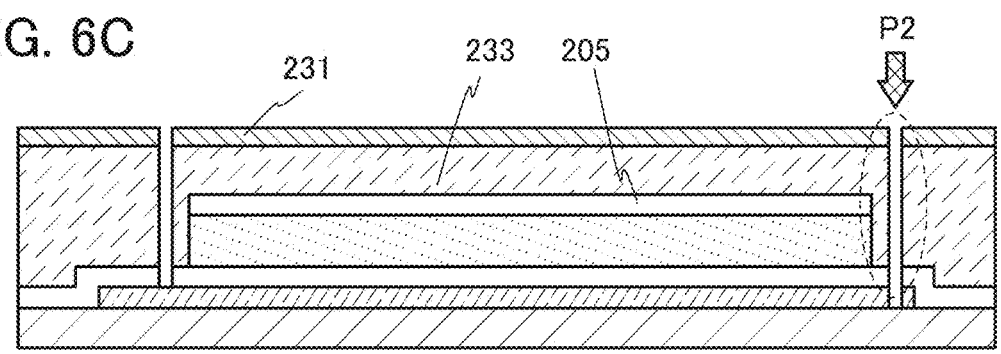

Next, the irradiation with the second laser light P2 is performed (FIG. 6C). The irradiation with the second laser light P2 is performed from the substrate 231 side to the formation substrate 221 side. The region which is irradiated with the second laser light P2 overlaps with at least part of the region which is irradiated with the first laser light P1.

Part of the separation layer 223 is removed or cut by being irradiated with the second laser light P2. In this manner, the separation starting point can be formed (FIGS. 6B and 6C).

As illustrated in FIG. 6A, in the case where there is a region where the formation substrate 221 and the substrate 231 are attached to each other using the adhesive layer 233 without overlapping with the separation layer 223, the yield of a subsequent separation process might be decreased depending on a degree of adhesion between the formation substrate 221 and the substrate 231. Thus, it is preferable to make a frame-like cut in a region where the adhesive layer 233 in a cured state and the separation layer 223 overlap with each other to form a separation starting point in a form of a solid line. This can improve the yield of the separation process.

Figure 6D:
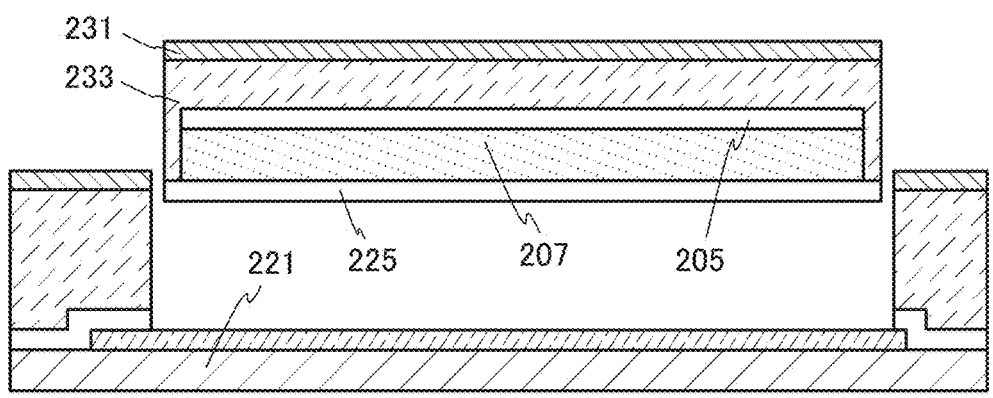

Then, the layer to be separated 225 and the formation substrate 221 are separated from each other from the formed separation starting point (FIG. 6D). Thus, the layer to be separated 225 can be transferred from the formation substrate 221 to the substrate 231.

In the above-described separation method of one embodiment of the present invention, separation is performed in such a manner that the separation starting point is formed using two kinds of laser light and then the interface between the separation layer and the layer to be separated is made in a state where separation is easily performed. This can improve the yield of the separation process.

Separation is performed after the pair of formation substrates each provided with the layer to be separated are attached to each other in advance, and then the layer to be separated can be transferred to the substrates of the device which is desirably manufactured. Thus, formation substrates having low flexibility can be attached to each other when the layers to be separated are attached to each other, whereby alignment accuracy at the time of attachment can be improved as compared with the case where flexible substrates are attached to each other.

<Separation Apparatus>

Figure 7:
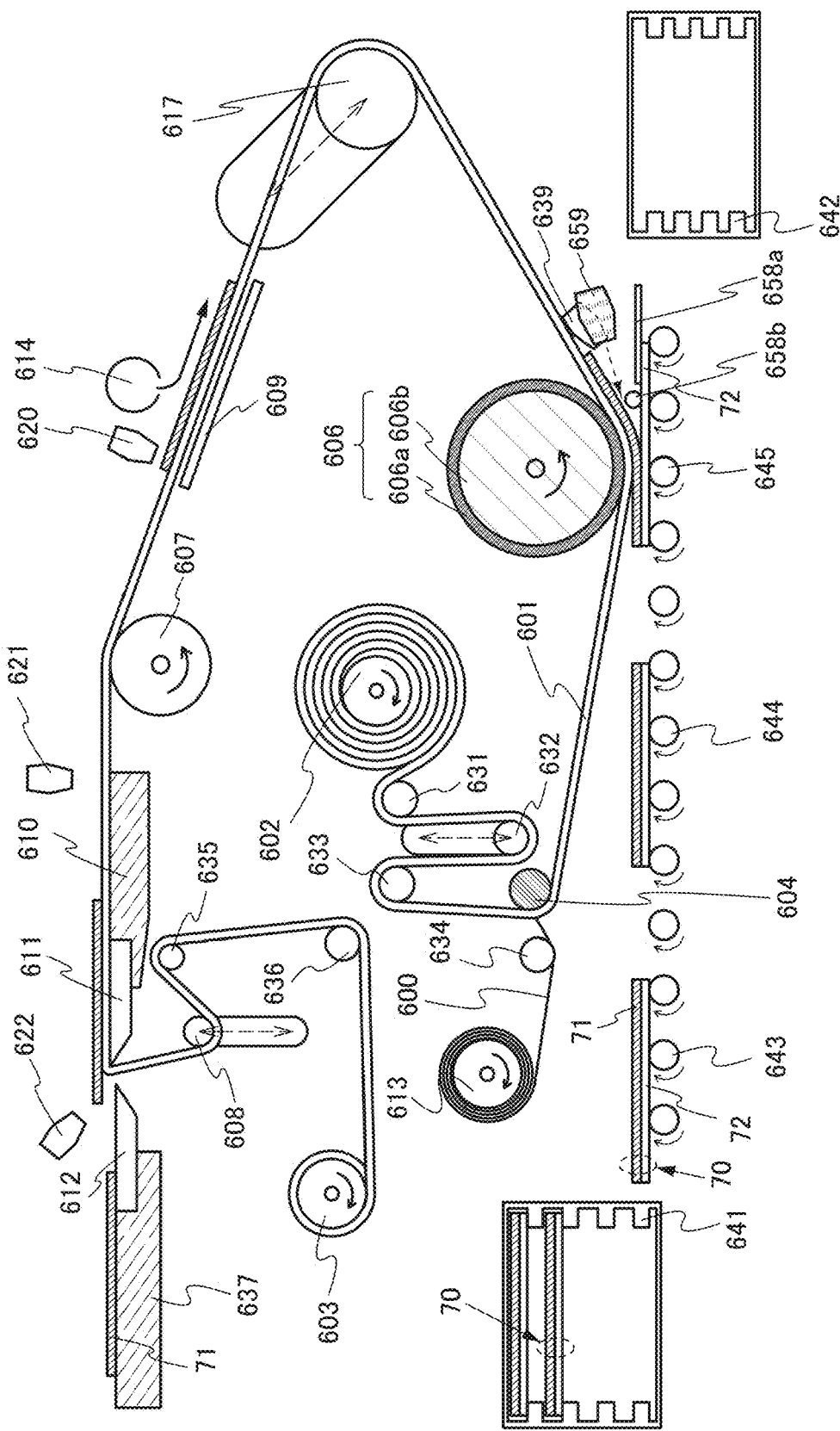
FIG. 7 illustrates an example of a separation apparatus.

FIG. 7 illustrates a structure example of a separation apparatus.

In this structure example, a first member 71 and a second member 72 are separated from each other by separating the first member 71 from a process member 70. Note that the first member 71 and the second member 72 may be separated from each other by separating the second member 72 from the process member 70.

The process member 70 has a sheet-like shape and includes the first member 71 and the second member 72 each having a sheet-like shape. The first member 71 and the second member 72 may each have a single-layer structure or a stacked-layer structure. A separation starting point is formed in the process member 70 by the method for forming a separation starting point that is one embodiment of the present invention. The separation starting point facilitates the separation at the interface between the first member 71 and the second member 72. The first member 71 includes at least one of a functional circuit, a functional element, and a functional film, for example. For example, the first member 71 can include at least one of a pixel circuit of a display device, a driver circuit of a display device, a display element, a light-emitting element, a color filter, and a moisture-proof film.

The separation apparatus in FIG. 7 includes a plurality of transfer rollers (e.g., transfer rollers 643, 644, and 645), a tape reel 602, a first wind-up reel 603, a direction changing roller 604, and a press roller 606.

The tape reel 602 can unwind a support body 601 in a rolled sheet form. The speed at which the support body 601 is unwound is preferably adjustable. When the speed is set relatively low, for example, failure in separation of the process member and a crack in a separated member can be inhibited.

The tape reel 602 may unwind the support body 601 continuously. The support body 601 can be unwound continuously in the case where unwinding of the support body 601 does not need to be stopped during the process. It is preferable to unwind the support body 601 continuously because separation can be performed at a uniform speed and with a uniform force. Note that in a separation process, the separation is preferably performed successively without a stop, and is further preferably performed at a constant speed. When the separation stops in the middle of the process and then resumes from the same region, distortion or the like occurs in the region, unlike in the case of successive separation. Thus, a minute structure of the region and the characteristics of an electronic device or the like in the region are changed, which might influence display of a display device, for example.

The tape reel 602 may unwind the support body 601 intermittently. The support body 601 may be unwound intermittently in the case where unwinding of the support body 601 needs to be stopped during the process. Note that at least during separation, the support body 601 is preferably unwound continuously for a higher yield of separation.

As the support body 601, a film in a rolled sheet form made of an organic resin, a metal, an alloy, glass, or the like can be used.

The support body 601 may be a carrier tape or the like, which is a member that is not a constituent of the device to be manufactured (e.g., flexible device). Alternatively, the support body 601 may be a flexible substrate or the like, which is a member that is a constituent of the device to be manufactured, like the first member 71.

The first wind-up reel 603 can wind up the support body 601.

The tape reel 602 includes one of a pair of tension applying mechanisms (not illustrated). The first wind-up reel 603 includes the other of the pair of tension applying mechanisms. The pair of tension applying mechanisms can apply tension to the support body 601.

Since a process member is separated while the pair of tension applying mechanisms applies tension to the support body 601 in the separation apparatus of one embodiment of the present invention, it is possible to inhibit slack in the first member 71 attached to the support body 601 as well as that of the support body 601, which can improve the yield of separation.

The plurality of transfer rollers can transfer the process member 70. The mechanism that transfers the process member 70 is not limited to a transfer roller and may be a different transfer mechanism such as a conveyor belt or a transfer robot. Furthermore, the process member 70 may be placed over a stage over the transfer mechanism.

The transfer roller 643, the transfer roller 644, and the transfer roller 645, each of which is one of the arranged transfer rollers, are provided at predetermined intervals and rotate in the direction in which the process member 70 (or the second member 72) is sent (the clockwise direction as indicated by solid arrows). The plurality of arranged transfer rollers are each rotated by a driving portion (e.g., a motor) which is not illustrated.

The delivery direction of the support body 601 can be changed by the direction changing roller 604. In the example illustrated in FIG. 7, the direction changing roller 604 is positioned between the tape reel 602 and the press roller 606.

The support body 601 is bonded to the first member 71 by the press roller 606 and the transfer roller 645. The separation apparatus in FIG. 7 has a structure in which the support body 601 is less likely to touch the first member 71 until it reaches the press roller 606. Accordingly, air bubbles can be inhibited from being trapped between the support body 601 and the process member 70. Thus, the adhesion between the support body 601 and the first member 71 can be increased, in which case the yield in dividing the process member 70 can be improved.

The press roller 606 is rotated by a driving portion (e.g., a motor) which is not illustrated. When the press roller 606 rotates, the force of separating the first member 71 is applied to the process member 70; thus, the first member 71 is separated. Separation of the first member 71 starts from the separation starting point. As a result, the process member 70 is divided into the first member 71 and the second member 72.

The mechanism that separates the first member 71 from the process member 70 is not limited to the press roller 606, and a structure body having a convex surface (or a convex curved surface) can be used. For example, a cylindrical (e.g., circular cylindrical, right circular cylindrical, elliptic cylindrical, or parabolic cylindrical) or spherical structure body can be used. Furthermore, a roller such as a drum type roller can be used, for example. Examples of the shape of the structure body include a column with a bottom surface whose boundary includes a curved line (e.g., a cylinder with a perfect circle-shaped bottom surface or an elliptic cylinder with an ellipse-shaped bottom surface), and a column with a bottom surface whose boundary includes a curved line and a straight line (e.g., a column with a semicircular bottom surface or a semi-elliptical bottom surface). If the shape of the structure body is any of such columns, the convex surface corresponds to a curved surface of the column.

Examples of a material for the structure body include a metal, an alloy, an organic resin, and rubber. The structure body may have a space or a hollow inside. Examples of the rubber include natural rubber, urethane rubber, nitrile rubber, and neoprene rubber. In the case of using rubber, it is preferable to use a material unlikely to be charged by friction or separation or to take countermeasures to prevent static electricity. For example, the press roller 606 illustrated in FIG. 7 includes a hollow cylinder 606*a* formed of rubber or an organic resin and a circular cylinder 606*b* formed of a metal or an alloy and positioned inside the cylinder 606*a*.

For example, the convex surface of the structure body can have a radius of curvature of greater than or equal to 0.5 mm and less than or equal to 3000 mm. In the case where a film is separated, for example, the radius of curvature of the convex surface can be greater than or equal to 0.5 mm and less than or equal to 1000 mm, and specifically can be 150 mm, 225 mm, or 300 mm. Examples of the structure body having such a convex surface include a roller with a diameter of 300 mm, 450 mm, or 600 mm. Note that a preferred radius of curvature of the convex surface depends on the thickness or the size of a process member.

When the radius of curvature of the convex surface is too small, an element included in the first member 71 which is separated along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be separated along the convex surface. For this reason, the radius of curvature of the convex surface is preferably greater than or equal to 300 mm, for example.

When the radius of curvature of the convex surface is large, the size of the separation apparatus might be increased, which might limit the installation location. For this reason, the radius of curvature of the convex surface is preferably less than or equal to 3000 mm, further preferably less than or equal to 1000 mm, still further preferably less than or equal to 500 mm, for example.

The rotation speed of the press roller 606 is preferably adjustable. By adjusting the rotation speed of the press roller 606, the yield of separation can be further increased.

The press roller 606 and the plurality of transfer rollers may be movable in at least one direction (e.g., the vertical direction, the horizontal direction, and the depth direction). The distance between the convex surface of the press roller 606 and a supporting surface of the transfer roller is preferably adjustable because separation can be performed on process members with various thicknesses.

FIG. 7 illustrates an example in which the angle at which the press roller 606 bends the support body 601 is an obtuse angle; however, one embodiment of the present invention is not particularly limited thereto.

It is preferable that the separation apparatus in FIG. 7 further include a flat plate 658*a*, a roller 658*b*, a liquid supply mechanism 659, and a roller 617.

The roller 617 has a convex surface. The roller 617 can deliver the support body 601 from the press roller 606 to the first wind-up reel 603 along the convex surface. The radius of curvature of the convex surface included in the roller 617 can be, for example, less than or equal to the radius of curvature of the convex surface included in the press roller 606, and preferably less than the radius of curvature of the convex surface included in the press roller 606.

The roller 617 can apply tension to the support body 601 by moving the shaft of the roller 617. That is, the roller 617 is also referred to as a tension roller. Specifically, the roller 617 can pull the support body 601 in the delivery direction changed with the press roller 606. As a result, slack in the support body 601 can be prevented and a portion where the press roller 606 is not adhered to the support body 601 is unlikely to be generated. Furthermore, the process member 70 can be divided into the first member 71 and the second member 72 with a high yield.

Moving the shaft of the roller 617 enables the roller 617 to control the angle α at which the press roller 606 bends the support body 601.

The roller 617 need not be movable only in one direction as illustrated in FIG. 7 and may be movable in two or more directions. Alternatively, the roller 617 is not necessarily provided.

The roller 617 can bend the support body 601 to change the delivery direction of the support body 601. In FIG. 7, the roller 617 bends the support body 601 to change the delivery direction of the support body 601; then, the delivery direction of the support body 601 is further changed to the horizontal direction by a direction changing roller 607 positioned between the roller 617 and the first wind-up reel 603.

The diameters of the direction changing roller 604 and the roller 617 are not limited and, for example, may be smaller than the diameter of the press roller 606. Materials that can be used for the press roller 606 can be used for each of the direction changing roller 604 and the roller 617.

The separation apparatus of one embodiment of the present invention preferably includes at least one of a flat-plate-like fixing mechanism and a roller-like fixing mechanism. The flat plate 658*a* is an example of the flat-plate-like fixing mechanism and the roller 658*b* is an example of the roller-like fixing mechanism. These fixing mechanisms can each fix the second member 72 exposed by the separation of the first member 71. Thus, these fixing mechanisms can each prevent the second member 72 from leaving the supporting surface. When the second member 72 leaves the supporting surface, the separation position changes and separation does not proceed normally in some cases. The second member 72 is preferably held down because the second member 72 can be fixed without fail.

Examples of the flat-plate-like fixing mechanism include a metal plate, an organic resin plate of acrylic, plastic, or the like, and a glass plate. Alternatively, an elastic flat plate using rubber, a spring, a resin, or the like may be used.

As the roller-like fixing mechanism, a nip roller or the like can be used.

Note that the fixing mechanism is not limited to the above examples, and a chuck such as a suction chuck, an electrostatic chuck, a mechanical chuck, or a porous chuck, or a table such as a suction table, a heater table, or a spinner table can also be used.

The separation apparatus of one embodiment of the present invention preferably includes the liquid supply mechanism 659. The liquid supply mechanism 659 can supply liquid to a separation surface between the first member 71 and the second member 72.

FIG. 7 illustrates an example in which separation is performed while liquid is supplied to the interface between the first member 71 and the second member 72 with the liquid supply mechanism 659.

The presence of the liquid in the portion where the separation proceeds can decrease the force required for the separation. Moreover, electrostatic discharge damage to an electronic device or the like can be prevented. Specifically, an adverse effect of static electricity caused at the time of separation (e.g., damage to a semiconductor element from static electricity) on a functional element or the like included in the first member 71 can be suppressed.

As the liquid, pure water is preferably used. It is also possible to use an organic solvent or the like. A neutral, alkaline, or acid aqueous solution, or an aqueous solution in which salt is dissolved can be used, for example. Note that liquid can be sprayed in the form of mist or vapor.

The liquid is preferably injected anytime after the formation of the separation starting point until the end of the separation.

The separation apparatus of one embodiment of the present invention includes the press roller 606; thus, liquid does not need to be injected through a slight aperture in the process member 70. During the process using the separation apparatus, specifically, at the start of separation of the first member 71 and the second member 72, a portion to which liquid is to be injected appears, and thus, liquid can be supplied to the desired portion easily without fail by using the liquid supply mechanism 659.

The separation apparatus may further include guide rollers (e.g., guide rollers 631, 632, and 633), a second wind-up reel 613, a drying mechanism 614, and ionizers (e.g., ionizers 639, 620, 621, and 622) as illustrated in FIG. 7.

The separation apparatus may include a guide roller that guides the support body 601 to the first wind-up reel 603. One guide roller may be used, or a plurality of guide rollers may be used. Like the guide roller 632 illustrated in FIG. 7, the guide roller may be capable of applying tension to the support body 601.

A separation tape 600 (also called separate film) may be bonded to at least one surface of the support body 601. In this case, the separation apparatus preferably includes a reel that can wind up the separation tape 600 bonded to one surface of the support body 601. FIG. 7 illustrates an example in which the second wind-up reel 613 is positioned between the tape reel 602 and the press roller 606. Furthermore, the separation apparatus may include a guide roller 634. The guide roller 634 can guide the separation tape 600 to the second wind-up reel 613.

The separation apparatus may include the drying mechanism 614. Since the functional element (e.g., a transistor or a thin-film integrated circuit) included in the first member 71 is vulnerable to static electricity, it is preferable that liquid be supplied to the interface between the first member 71 and the second member 72 before separation or that the separation be performed while liquid is supplied to the interface. Since a watermark might be formed if the liquid adhered to the first member 71 is vaporized, the liquid is preferably removed immediately after the separation. Thus, immediately after the separation from the second member 72, the first member 71 including a functional element is preferably blow-dried to remove a droplet left on the first member 71. Therefore, watermark generation can be suppressed. A carrier plate 609 may be provided to prevent slack in the support body 601.

As illustrated in FIG. 7, it is preferable that an air flow downward along the inclination of the support body 601 so that the droplet drips down while the support body 601 is transferred in an oblique direction relative to the horizontal plane.

Although the transfer direction of the support body 601 may be perpendicular to the horizontal plane, the transfer direction is preferably oblique to the horizontal plane for higher stability and less shaking of the support body 601 during the transfer.

During the process, a static eliminator included in the separation apparatus is preferably used at a position where static electricity might be generated. There is no particular limitation on the static eliminator, and for example, a corona discharge ionizer, a soft X-ray ionizer, or an ultraviolet ionizer can be used.

For example, it is preferable that the separation apparatus be provided with an ionizer and static elimination be performed by spraying the first member 71 with air, a nitrogen gas, or the like from the ionizer to reduce adverse effects of static electricity on the functional element. It is particularly preferable to use the ionizer in a step of bonding two members to each other and a step of dividing one member.

For example, the process member 70 is preferably divided into the first member 71 and the second member 72 while the vicinity of the interface between the first member 71 and the second member 72 is irradiated with ions using the ionizer 639 to remove static electricity.

The separation apparatus may include at least one of a substrate load cassette 641 and a substrate unload cassette 642. For example, the process member 70 can be supplied to the substrate load cassette 641. The substrate load cassette 641 can supply the process member 70 to the transfer mechanism or the like. Furthermore, the second member 72 can be supplied to the substrate unload cassette 642.

The process member 70 may be transferred from the substrate load cassette 641 onto the guide roller with the transfer mechanism of the separation apparatus. The second member 72 over the guide roller may be transferred to the substrate unload cassette 642 with the transfer mechanism. In the case where the separation apparatus is connected to a different apparatus, the process member 70 may be transferred from the different apparatus onto the guide roller with the transfer mechanism. In other words, the separation apparatus does not necessarily include the substrate load cassette 641. The second member 72 over the guide roller may be transferred to a different apparatus with the transfer mechanism. In other words, the separation apparatus does not necessarily include the substrate unload cassette 642.

In the separation apparatus of one embodiment of the present invention, the transfer rollers such as the transfer rollers 643, 644, and 645, the press roller 606, and the like are driving rollers rotated by an electric motor or the like. The rotation speed of the tape reel 602 and the first wind-up reel 603 is also adjusted with a motor. These driving rollers, the tape reel 602, and the first wind-up reel 603 adjust the moving speed and tension of the support body 601. A plurality of guide rollers 631, 632, 633, 634, 635, and 636, the direction changing rollers 604 and 607, a tension roller 608, and the like are driven rollers. Note that in one embodiment of the present invention, whether each roller is a driving roller or a driven roller can be determined as appropriate without being limited to the above-described example. The roller 617 may be a driving roller or a driven roller. The number of rollers of each kind included in the separation apparatus of one embodiment of the present invention is not particularly limited.

As described above, in the separation apparatus of one embodiment of the present invention, the support body that is attached to the process member is pulled to separate the first member from the second member. The process member can be automatically divided with the use of the support body, which shortens processing time and improves the manufacturing yield of products.

For example, the process member has a structure in which a formation substrate and a functional layer are stacked in this order. The functional layer corresponds to the first member and the formation substrate corresponds to the second member. Here, the support body may be used as a support body of the functional layer. In other words, the support body is not necessarily separated from the first member. When a flexible substrate and the functional layer that is exposed by being separated from the formation substrate are bonded to each other with the use of an adhesive, a flexible device in which the support body, the functional layer, and the flexible substrate are stacked in this order can be manufactured.

Alternatively, the process member has a structure in which a formation substrate, a functional layer, and a flexible substrate are stacked in this order, for example. The functional layer and the flexible substrate correspond to the first member and the formation substrate corresponds to the second member. Since the support body attached to the flexible substrate is unnecessary after separation, the support body is separated from the first member. When another flexible substrate and the functional layer that is exposed by being separated from the formation substrate are bonded to each other with the use of an adhesive, a flexible device in which the flexible substrate, the functional layer, and the flexible substrate are stacked in this order can be manufactured.

Here, when force is applied to the support body for separation of the support body, failure in separation or a crack in the first member might occur depending on the delivery speed, delivery direction, or the like of the support body.

By including the components described below, the separation apparatus of one embodiment of the present invention can automatically separate the support body and the first member from each other and can have shorter processing time and a higher manufacturing yield of products.

The separation apparatus in FIG. 7 includes a carrier plate 610, a first wedge-shaped member 611, a second wedge-shaped member 612, a table 637, the tension roller 608, and the guide rollers 635 and 636.

The guide rollers 635 and 636 guide the support body 601 to the first wind-up reel 603.

The tension roller 608 is positioned between the roller 617 and the first wind-up reel 603. The tension roller 608 can apply tension in the direction in which the support body 601 is bent.

As a roller that guides the support body 601 to the first wind-up reel 603, at least one of the guide rollers 635 and 636 and the tension roller 608 is preferably provided.

The first wedge-shaped member 611 is preferably provided in a position where the support body 601 is bent with the guide roller 635 or 636 or the tension roller 608. The first wedge-shaped member 611 may be fixed to the carrier plate 610. The first wedge-shaped member 611 has a tapered portion. The direction in which the support body 601 is bent is determined by the angle between a flat surface of the carrier plate 610 and the tapered portion of the first wedge-shaped member 611.

The angle of the direction in which the support body 601 is bent is preferably, but not limited to, an acute angle to facilitate separation of the first member 71 from the support body 601.

The second wedge-shaped member 612 is fixed to the table 637. The first wind-up reel 603 can wind up the support body 601 that has passed between the first wedge-shaped member 611 and the second wedge-shaped member 612.

The table 637 has a flat surface. The first member 71 separated from the support body 601 is placed on the flat surface.

The flat surface of the carrier plate 610 is preferably positioned higher than the flat surface of the table 637. In other words, the flat surface of the carrier plate 610 and that of the table 637 are not on the same plane and are located at different levels in cross section. As long as the flat surfaces are located at different levels, the first wedge-shaped member 611 and the second wedge-shaped member 612 do not necessarily overlap with each other when seen from above. In the case where the first wedge-shaped member 611 and the second wedge-shaped member 612 overlap with each other, a tip of the second wedge-shaped member 612 is positioned below the first wedge-shaped member 611.

Note that a subsequent step may be performed without separating the first member 71 from the support body 601. For example, the first member 71 and another member may be attached to each other with an adhesive.

This embodiment can be combined with any of other embodiments as appropriate.

(Embodiment 2)

In this embodiment, a structure and a manufacturing method of a light-emitting panel that can be used in one embodiment of the present invention will be described with reference to FIGS. 8A to 8D, FIGS. 9A and 9B, FIGS. 10A and 10B, FIGS. 11A and 11B, FIG. 12, FIGS. 13A to 13D, FIG. 14, FIG. 15, FIGS. 16A and 16B, FIG. 17, and FIGS. 18A and 18B. In this embodiment, a light-emitting panel that includes an EL element as a light-emitting element is described as an example.

Note that a module including the light-emitting panel described in this embodiment and at least one of a connector such as a flexible printed circuit (hereinafter referred to as an FPC) or a tape carrier package (TCP) and an integrated circuit (IC) can be manufactured using one embodiment of the present invention.

FIGS. 8A to 8D each illustrate a light-emitting panel including a pair of substrates (a substrate 371 and a substrate 372). The light-emitting panel includes a light-emitting portion 381 and a driver circuit portion 382. An FPC 373 is connected to the light-emitting panel. The FPC 373 is electrically connected to an external connection electrode (not illustrated) over the substrate 371.

FIG. 8A illustrates an example of the light-emitting panel including the driver circuit portion 382 on one side.

FIGS. 8B and 8C each illustrate an example of the light-emitting panel including the driver circuit portion 382 on each of two sides. In FIG. 8B, the driver circuit portions 382 are provided along the opposite sides. In FIG. 8C, the driver circuit portions 382 are provided along a short side and a long side of the light-emitting panel.

FIG. 8D illustrates an example of the light-emitting panel in which the light-emitting portion 381 has a circular top-view shape. The light-emitting portion 381 does not necessarily have a polygonal top-view shape and may have any of a variety of top-view shapes such as circular and elliptical shapes.

The light-emitting panel does not necessarily have a polygonal top-view shape and may have any of a variety of top-view shapes such as circular and elliptical shapes. The light-emitting panel in FIG. 8D has a top-view shape including both a curved portion and a linear portion.

<Structure Example 1>

FIGS. 9A and 9B are cross-sectional views of the light-emitting panel employing a color filter method and having a top-emission structure.

In this embodiment, the light-emitting panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on color elements, and colors other than R, G, B, W, and Y may be used. For example, cyan or magenta may be used.

The light-emitting panel illustrated in FIGS. 9A and 9B includes the substrate 371, an adhesive layer 377, an insulating layer 378, a plurality of transistors, a capacitor 305, a conductive layer 307, an insulating layer 312, an insulating layer 313, an insulating layer 314, an insulating layer 315, a light-emitting element 304, a conductive layer 355, a spacer 316, an adhesive layer 317, a coloring layer 325, a light-blocking layer 326, the substrate 372, an adhesive layer 375, and an insulating layer 376.

The light-emitting panel illustrated in FIG. 9A can be manufactured using the separation method described in Embodiment 1. Specifically, the insulating layer 378, a plurality of transistors, the capacitor 305, the conductive layer 307, the insulating layers 312 to 315, the light-emitting element 304, the conductive layer 355, and the spacer 316 are formed over a formation substrate as a layer to be separated. In addition, the insulating layer 376, the coloring layer 325, and the light-blocking layer 326 are formed over another formation substrate as a layer to be separated. The pair of formation substrates are attached to each other with the adhesive layer 317 and then the formation substrates are removed by separation. There is no particular limitation on the separation order of the formation substrates. For example, in the case where the formation substrate over which the transistors are formed is separated first, the exposed insulating layer 378 and the substrate 371 are then attached to each other with the adhesive layer 377. After that, a separation starting point is formed by the method for forming a separation starting point that is one embodiment of the present invention. Next, the remaining formation substrate is separated, and the exposed insulating layer 376 and the substrate 372 are attached to each other with the adhesive layer 375.

The driver circuit portion 382 includes a transistor 301. The light-emitting portion 381 includes a transistor 302 and a transistor 303.

Each transistor includes a gate, a gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305.

In FIGS. 9A and 9B, bottom-gate transistors are illustrated. The transistors in the driver circuit portion 382 and the transistors in the light-emitting portion 381 may have different structures. The driver circuit portion 382 and the light-emitting portion 381 may each include a plurality of kinds of transistors.

The capacitor 305 includes a pair of electrodes and the dielectric therebetween. The capacitor 305 includes a conductive layer that is formed using the same material and the same step as the gate of the transistor and a conductive layer that is formed using the same material and the same step as the source and the drain of the transistor.

The insulating layer 312, the insulating layer 313, and the insulating layer 314 are each provided to cover the transistors and the like. The number of the insulating layers covering the transistors and the like is not particularly limited. The insulating layer 314 functions as a planarization layer. A material through which impurities such as water and hydrogen do not easily diffuse is preferably used for at least one of the insulating layers 312, 313, and 314. Diffusion of impurities from the outside into the transistors can be effectively inhibited, leading to improved reliability of the light-emitting panel.

FIG. 9A is a cross-sectional view in which the insulating layer 314 extends to end portions of the light-emitting panel. The insulating layer 314 is preferably provided in the entire area of the light-emitting panel as illustrated in FIG. 9A, in which case the yield of the separation process can be increased.

FIG. 9B is a cross-sectional view in which the insulating layer 314 is not positioned at the end portions of the light-emitting panel. An insulating layer formed using an organic material is not positioned at the end portions of the light-emitting panel in the structure of FIG. 9B; thus, impurities such as moisture entering from the outside of the light-emitting panel are less likely to reach the light-emitting element 304. Since entry of impurities into the light-emitting element 304 can be inhibited, the deterioration of the light-emitting element 304 and the light-emitting panel can be suppressed.

The light-emitting element 304 includes an electrode 321, an EL layer 322, and an electrode 323. The light-emitting element 304 may include an optical adjustment layer 324. The light-emitting element 304 has a top-emission structure with which light is emitted to the coloring layer 325 side.

The transistor, the capacitor, the wiring, and the like are provided to overlap with a light-emitting region of the light-emitting element 304, whereby an aperture ratio of the light-emitting portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting substance.

The electrode 323 functions as a common electrode and is provided for a plurality of light-emitting elements 304. A constant potential is supplied to the electrode 323.

The light-emitting element 304 overlaps with the coloring layer 325 with the adhesive layer 317 provided therebetween. The spacer 316 overlaps with the light-blocking layer 326 with the adhesive layer 317 provided therebetween. In the example illustrated in FIGS. 9A and 9B, there is a gap between the electrode 323 and the light-blocking layer 326, which may however be in contact with each other. Although the spacer 316 is provided on the substrate 371 side in the structure illustrated in FIGS. 9A and 9B, the spacer 316 may be provided on the substrate 372 side (e.g., in a position closer to the substrate 371 than that of the light-blocking layer 326).

Owing to the combination of a color filter (the coloring layer 325) and a microcavity structure (the optical adjustment layer 324), light with high color purity can be extracted from the light-emitting panel. The thickness of the optical adjustment layer 324 is varied depending on the emission color of the pixel.

The coloring layer 325 is a colored layer that transmits light in a specific wavelength range. For example, a color filter for transmitting light in a red, green, blue, or yellow wavelength range can be used. Examples of a material that can be used for the coloring layer include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer 326 is provided between the adjacent coloring layers 325. The light-blocking layer 326 blocks light emitted from a light-emitting element to inhibit color mixture between adjacent light-emitting elements. Here, the coloring layer 325 is provided such that its end portion overlaps with the light-blocking layer 326, whereby light leakage can be reduced. For the light-blocking layer 326, a material that blocks light from the light-emitting element can be used; for example, a black matrix can be formed using a metal material or a resin material containing pigment or dye. Note that it is preferable to provide the light-blocking layer 326 in a region other than a pixel portion, such as a driver circuit, in which case undesired leakage of guided light or the like can be suppressed.

FIG. 9B illustrates an example in which an overcoat 329 covering the coloring layer 325 and the light-blocking layer 326 is provided. The overcoat 329 can prevent impurities and the like contained in the coloring layer 325 from being diffused into the light-emitting element. The overcoat 329 is formed with a material that transmits light emitted from the light-emitting element 304; for example, an inorganic insulating film such as a silicon nitride film or a silicon oxide film, or an organic insulating film such as an acrylic film or a polyimide film can be used, and further, a stacked structure of an organic insulating film and an inorganic insulating film may be employed.

In the case where upper surfaces of the coloring layer 325 and the light-blocking layer 326 are coated with a material for the adhesive layer 317, a material that has high wettability with respect to the material for the adhesive layer 317 is preferably used as the material for the overcoat 329. For example, an oxide conductive film such as an indium tin oxide (ITO) film or a metal film such as an Ag film which is thin enough to transmit light is preferably used as the overcoat 329.

When the overcoat 329 is formed using a material that has high wettability with respect to the material for the adhesive layer 317, the material for the adhesive layer 317 can be uniformly applied. Thus, entry of bubbles in the step of attaching the pair of substrates to each other can be prevented, and thus a display defect can be inhibited.

The insulating layer 378 and the substrate 371 are attached to each other with the adhesive layer 377. The insulating layer 376 and the substrate 372 are attached to each other with the adhesive layer 375. The insulating layer 376 and the insulating layer 378 are preferably highly resistant to moisture. The light-emitting element 304, the transistors, and the like are preferably provided between a pair of insulating layers which are highly resistant to moisture, in which case impurities such as moisture can be prevented from entering these elements, leading to higher reliability of the light-emitting panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

A connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is described. The FPC 373 and the conductive layer 355 are electrically connected to each other through a connector 319.

As the connector 319, any of various anisotropic conductive films (ACF), anisotropic conductive pastes (ACP), and the like can be used.

The substrate included in the light-emitting panel of one embodiment of the present invention preferably has flexibility. For the flexible substrate, a material such as glass, quartz, a resin, a metal, an alloy, or a semiconductor that is thin enough to have flexibility can be used. The substrate through which light from the light-emitting element is extracted is formed using a material that transmits the light. For example, the thickness of the flexible substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, yet further preferably greater than or equal to 10 μm and less than or equal to 25 μm. The thickness and hardness of the flexible substrate are set in the range where mechanical strength and flexibility can be balanced against each other. The flexible substrate may have a single-layer structure or a stacked-layer structure.

Although there is no particular limitation on a material for the metal substrate or the alloy substrate, it is preferable to use, for example, aluminum, copper, nickel, or a metal alloy such as an aluminum alloy or stainless steel. Examples of a material for a semiconductor substrate include silicon and the like.

Examples of materials having flexibility and a light-transmitting property include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. In particular, a material with a low coefficient of linear expansion is preferred, and for example, a polyamide-imide resin, a polyimide resin, a polyamide resin, or PET can be suitably used. A substrate in which a fibrous body is impregnated with a resin (also referred to as prepreg), a substrate whose coefficient of linear expansion is reduced by mixing a resin with an inorganic filler, and the like can also be used.

The flexible substrate may have a stacked-layer structure in which at least one of a hard coat layer (e.g., an inorganic layer such as a silicon nitride layer or an organic layer such as an acrylic resin layer) which protects a surface of a device from damage or the like, a layer (e.g., an aramid resin layer) which can disperse pressure, and the like is stacked over a layer of any of the above-mentioned materials. For example, a resin film may be provided between a pair of hard coat layers.

As the adhesive layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the adhesive layer may include a drying agent. The drying agent is preferably included because it can prevent impurities such as moisture from entering the functional element, thereby improving the reliability of the light-emitting panel.

When a filler with a high refractive index or a light scattering member is contained in the adhesive layer, the efficiency of light extraction from the light-emitting element can be improved.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, ITO, indium zinc oxide, zinc oxide (ZnO), or ZnO containing gallium. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride), or the like can be used when formed thin enough to have a light-transmitting property. Alternatively, a stacked film of any of the above materials can be used as the conductive film. For example, a stacked film of ITO and an alloy of silver and magnesium is preferably used because the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy of silver and copper is preferable because of its high heat resistance. Furthermore, when a metal film or a metal oxide film is stacked in contact with an aluminum alloy film, oxidation of the aluminum alloy film can be inhibited. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an ink-jet method, a printing method such as a screen printing method, or a plating method may be used.

The EL layer 322 includes at least a light-emitting layer. The EL layer 322 may include a plurality of light-emitting layers. In addition to the light-emitting layer, the EL layer 322 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 322, either a low molecular compound or a high molecular compound can be used, and an inorganic compound may also be used. Each of the layers included in the EL layer 322 can be formed by any of the following methods: an evaporation method (including a vacuum evaporation method), a transfer method, a printing method, an ink-jet method, a coating method, and the like.

The light-emitting element 304 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 304 preferably has two or more peaks in the wavelength range in a visible region (e.g., greater than or equal to 350 nm and less than or equal to 750 nm or greater than or equal to 400 nm and less than or equal to 800 nm).

Moreover, the light-emitting element 304 may be a single element including one EL layer or a tandem element in which EL layers are stacked with a charge generation layer provided therebetween.

In one embodiment of the present invention, a light-emitting element containing an inorganic compound such as a quantum dot may be employed.

Examples of quantum dot materials include a colloidal quantum dot material, an alloyed quantum dot material, a core-shell quantum dot material, and a core quantum dot material. For example, an element such as cadmium (Cd), selenium (Se), zinc (Zn), sulfur (S), phosphorus (P), indium (In), tellurium (Te), lead (Pb), gallium (Ga), arsenic (As), or aluminum (Al) may be contained.

The structure of the transistors in the light-emitting panel is not particularly limited. For example, a planar transistor, a staggered transistor, or an inverted staggered transistor may be used. Furthermore, a top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). The oxide semiconductor further preferably contains an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible light-emitting panel does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single crystal structure. An example of such structures is a nano-crystal (nc) structure, which is an aggregate of nanoscale microcrystals. The crystallinity of a CAAC-OS structure is lower than that of a single crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the light-emitting panel. Examples of resins include an acrylic resin, an epoxy resin, a polyimide resin, a polyamide resin, a polyimide-amide resin, a siloxane resin, a benzocyclobutene-based resin, and a phenol resin. Examples of an inorganic insulating film include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the light-emitting panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO containing gallium, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film containing graphene may be used as well. The film containing graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

<Structure Example 2>

FIG. 10A is a cross-sectional view of a light-emitting panel employing a color filter method. Note that in the following structure examples, components similar to those in the above structure example will not be described in detail.

The light-emitting panel in FIG. 10A includes the substrate 371, the adhesive layer 377, the insulating layer 378, a plurality of transistors, the conductive layer 307, the insulating layer 312, the insulating layer 313, the insulating layer 314, the insulating layer 315, the light-emitting element 304, the conductive layer 355, the adhesive layer 317, the coloring layer 325, the substrate 372, and the insulating layer 376.

The driver circuit portion 382 includes the transistor 301. The light-emitting portion 381 includes the transistor 303.

Each transistor includes two gates, the gate insulating layer 311, a semiconductor layer, a source, and a drain. The two gates each overlap with the semiconductor layer with the gate insulating layer 311 provided therebetween. FIG. 10A illustrates an example in which each transistor has a structure in which the semiconductor layer is provided between the two gates. Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a light-emitting panel in which the number of wirings is increased because of increase in size or resolution. FIG. 10A illustrates an example in which one of the gates is formed using the same material and the same step as the electrode 321.

The light-emitting element 304 has a bottom-emission structure with which light is emitted to the coloring layer 325 side.

The light-emitting element 304 overlaps with the coloring layer 325 with the insulating layer 314 provided therebetween. The coloring layer 325 is provided between the light-emitting element 304 and the substrate 371. FIG. 10A illustrates an example in which the coloring layer 325 is provided over the insulating layer 313. In the example illustrated in FIG. 10A, a light-blocking layer and a spacer are not provided.

In FIG. 10A, an opening which reaches an inorganic film (here, the insulating layer 313) is formed in the insulating layer 314; thus, impurities such as moisture entering from the outside of the light-emitting panel are less likely to reach the light-emitting element 304.

<Structure Example 3>

FIG. 10B is a cross-sectional view of a light-emitting panel employing a separate coloring method.

The light-emitting panel in FIG. 10B includes the substrate 371, the adhesive layer 377, the insulating layer 378, a plurality of transistors, the conductive layer 307, the insulating layer 312, the insulating layer 313, the insulating layer 314, the insulating layer 315, the spacer 316, the light-emitting element 304, the adhesive layer 317, the substrate 372, and the insulating layer 376.

The driver circuit portion 382 includes the transistor 301. The light-emitting portion 381 includes the transistor 302, the transistor 303, and the capacitor 305.

Each transistor includes two gates, the gate insulating layer 311, a semiconductor layer, a source, and a drain. The two gates each overlap with the semiconductor layer with the gate insulating layer 311 provided therebetween. FIG. 10B illustrates an example in which each transistor has a structure in which the semiconductor layer is provided between the two gates. In the example illustrated in FIG. 10B, one of the gates is formed between the insulating layer 313 and the insulating layer 314.

The light-emitting element 304 has a top-emission structure with which light is emitted to the substrate 372 side. In the example illustrated in FIG. 10B, the light-emitting element 304 does not include an optical adjustment layer. The insulating layer 376 serves as a sealing layer for the light-emitting element 304.

The connection portion 306 includes the conductive layer 307. The conductive layer 307 is electrically connected to the FPC 373 through the connector 319.

<Application Example>

In one embodiment of the present invention, a light-emitting panel provided with a touch sensor (hereinafter, also referred to as a touch panel) can be manufactured.

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive type is preferable because multiple points can be sensed simultaneously.

The touch panel of one embodiment of the present invention can have any of a variety of structures, including a structure in which a light-emitting panel and a sensor element that are separately formed are attached to each other and a structure in which an electrode and the like included in a sensor element are provided on one or both of a substrate supporting a light-emitting element and a counter substrate.

<Structure Example 4>

Figure 11A:
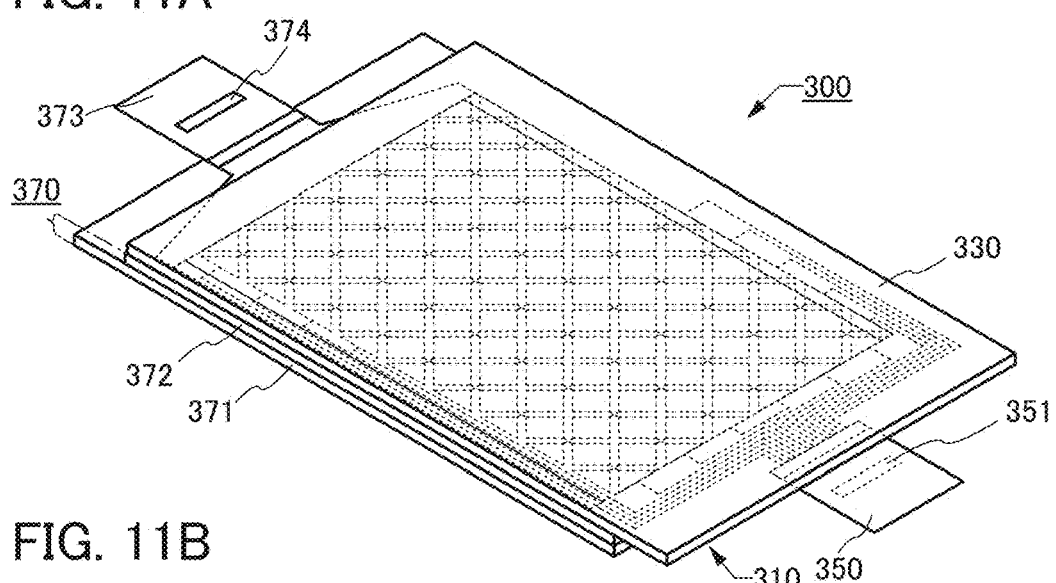
FIGS. 11A and 11B are perspective views illustrating an example of a touch panel.
Figure 11B:
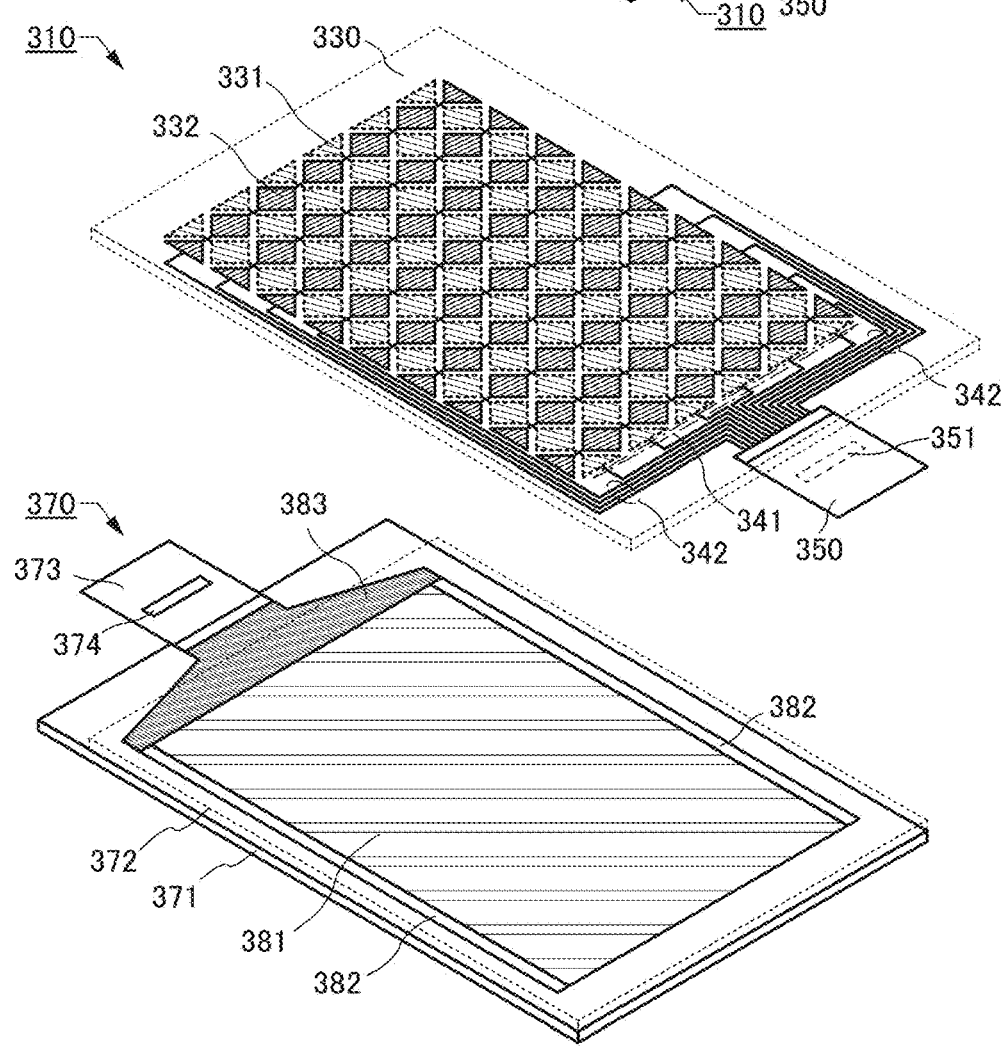

FIG. 11A is a schematic perspective view of a touch panel 300. FIG. 11B is a developed view of the schematic perspective view of FIG. 11A. Note that only typical components are illustrated for simplicity. In FIG. 11B, some components (such as a substrate 330 and the substrate 372) are illustrated only in dashed outline.

The touch panel 300 includes an input panel 310 and a light-emitting panel 370, which are provided to overlap with each other.

The input panel 310 includes the substrate 330, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The light-emitting panel 370 includes the substrate 371 and the substrate 372 which are provided to face each other. The light-emitting panel 370 includes the light-emitting portion 381 and the driver circuit portion 382. A wiring 383 and the like are provided over the substrate 371. The FPC 373 is electrically connected to the wiring 383. The FPC 373 is provided with an IC 374.

The wiring 383 has a function of supplying a signal or electric power to the light-emitting portion 381 or the driver circuit portion 382. The signal or electric power is input to the wiring 383 from the outside or the IC 374 through the FPC 373.

Figure 12:
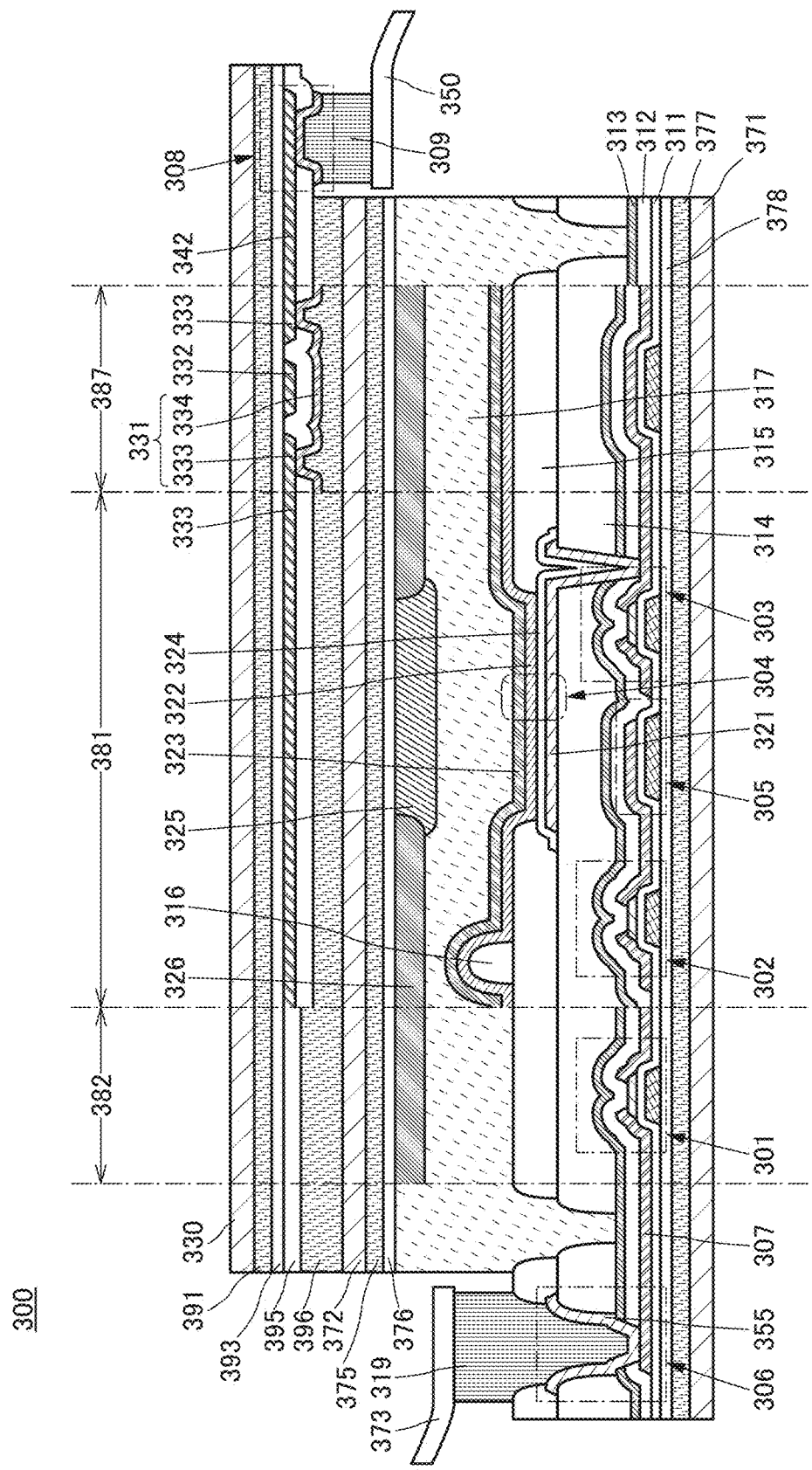
FIG. 12 is a cross-sectional view illustrating an example of a touch panel.

FIG. 12 illustrates an example of a cross-sectional view of the touch panel 300. FIG. 12 illustrates cross-sectional structures of the light-emitting portion 381, the driver circuit portion 382, a region including the FPC 373, a region including the FPC 350, and the like. Furthermore, FIG. 12 illustrates a cross-sectional structure of a crossing portion 387 where a wiring formed by processing a conductive layer used for forming the gate of the transistor and a wiring formed by processing a conductive layer used for forming the source and the drain of the transistor cross each other.

The substrate 371 and the substrate 372 are attached to each other with the adhesive layer 317. The substrate 372 and the substrate 330 are attached to each other with an adhesive layer 396. Here, the layers from the substrate 371 to the substrate 372 correspond to the light-emitting panel 370. Furthermore, the layers from the substrate 330 to an electrode 334 correspond to the input panel 310. In other words, the adhesive layer 396 attaches the light-emitting panel 370 and the input panel 310 to each other. Alternatively, the layers from the substrate 371 to the insulating layer 376 correspond to the light-emitting panel 370. Furthermore, the layers from the substrate 330 to the substrate 372 correspond to the input panel 310. In other words, the adhesive layer 375 attaches the light-emitting panel 370 and the input panel 310 to each other.

The light-emitting panel 370 illustrated in FIG. 12 has the same structure as the light-emitting panel illustrated in FIG. 9A except that an opening which reaches the insulating layer 313 is formed in the insulating layer 314 and the insulating layer 315; thus, detailed description thereof is omitted.

<Input Panel 310>

The electrode 331 and the electrode 332 are provided on the substrate 372 side of the substrate 330. An example in which the electrode 331 includes an electrode 333 and the electrode 334 is described here. As illustrated in the crossing portion 387 in FIG. 12, the electrode 332 and the electrode 333 are formed on the same plane. An insulating layer 395 is provided to cover the electrode 332 and the electrode 333. The electrode 334 electrically connects two electrodes 333, between which the electrode 332 is provided, through openings formed in the insulating layer 395.

A connection portion 308 is provided in a region near an end portion of the substrate 330. The connection portion 308 has a stack including a wiring 342 and a conductive layer formed by processing a conductive layer used for forming the electrode 334. The connection portion 308 is electrically connected to the FPC 350 through a connector 309.

The substrate 330 is attached to an insulating layer 393 with an adhesive layer 391. The input panel 310 can also be manufactured by forming elements over a formation substrate, separating the formation substrate, and then transferring the elements over the substrate 330. Alternatively, the insulating layer 393, the elements, and the like may be directly formed on the substrate 330 (see FIG. 13A).

<Structure Example 5>

Figure 13:
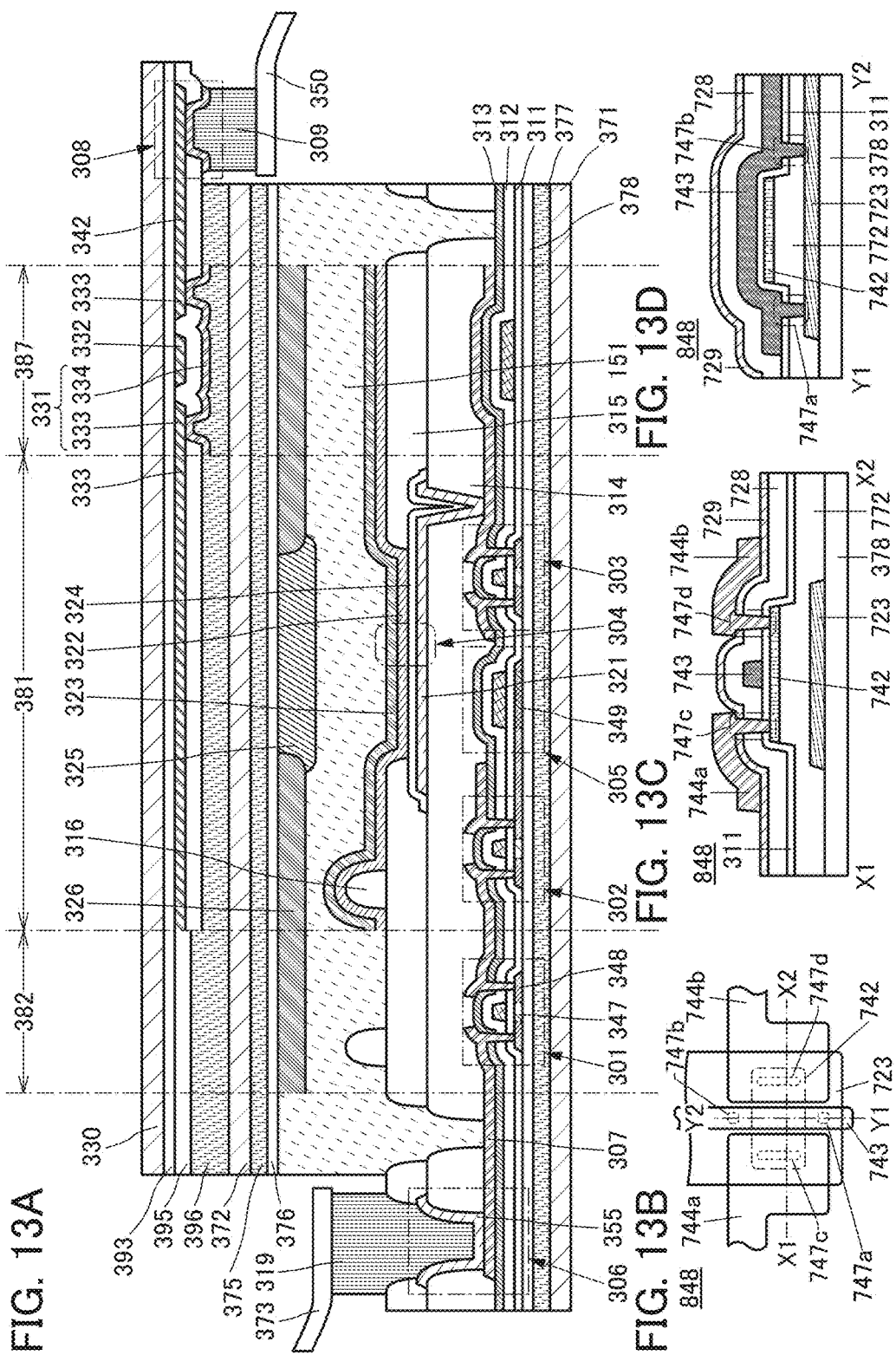
FIG. 13A is a cross-sectional view illustrating an example of a touch panel.
FIGS. 13B to 13D are a top view and cross-sectional views of a transistor.

A touch panel illustrated in FIG. 13A is different from the touch panel illustrated in FIG. 12 in the structures of the transistors 301, 302, and 303 and the capacitor 305 and in not including the adhesive layer 391.

FIG. 13A illustrates a transistor having a top-gate structure.

Each transistor includes a gate, the gate insulating layer 311, a semiconductor layer, a source, and a drain. The gate and the semiconductor layer overlap with each other with the gate insulating layer 311 provided therebetween. The semiconductor layer may include low-resistance regions 348. The low-resistance regions 348 function as the source and the drain of the transistor.

The conductive layer over the insulating layer 313 functions as a lead wiring. The conductive layer is electrically connected to the region 348 through an opening provided in the insulating layer 313, the insulating layer 312, and the gate insulating layer 311.

In FIG. 13A, the capacitor 305 has a stacked-layer structure including a layer formed by processing a semiconductor layer used for forming the above-described semiconductor layer, the gate insulating layer 311, and a layer formed by processing a conductive layer used for forming the gate. Here, part of the semiconductor layer of the capacitor 305 preferably has a region 349 having a higher conductivity than a region 347 where the channel of the transistor is formed.

The region 348 and the region 349 each can be a region containing more impurities than the region 347 where the channel of the transistor is formed, a region with a high carrier concentration, a region with low crystallinity, or the like.

A transistor 848 illustrated in FIGS. 13B to 13D can be used in the light-emitting panel of one embodiment of the present invention.

FIG. 13B is a top view of the transistor 848. FIG. 13C is a cross-sectional view in the channel length direction of the transistor 848 in the light-emitting panel of one embodiment of the present invention. The cross section of the transistor 848 illustrated in FIG. 13C is taken along the dashed-dotted line X1-X2 in FIG. 13B. FIG. 13D is a cross-sectional view in the channel width direction of the transistor 848 in the light-emitting panel of one embodiment of the present invention. The cross section of the transistor 848 illustrated in FIG. 13D is taken along the dashed-dotted line Y1-Y2 in FIG. 13B.

The transistor 848 is a type of top-gate transistor including a back gate.

In the transistor 848, a semiconductor layer 742 is formed over a projection of an insulating layer 772. When the semiconductor layer 742 is provided over the projection of the insulating layer 772, the side surface of the semiconductor layer 742 can also be covered with a gate 743. Thus, the transistor 848 has a structure in which the semiconductor layer 742 can be electrically surrounded by an electric field of the gate 743. Such a structure of a transistor in which a semiconductor film in which a channel is formed is electrically surrounded by an electric field of a conductive film is called a surrounded channel (s-channel) structure. A transistor having an s-channel structure is referred to as an s-channel transistor.

In an s-channel structure, a channel can be formed in the whole (bulk) of the semiconductor layer 742. In the s-channel transistor, the drain current of the transistor can be increased, so that a larger amount of on-state current can be obtained. Furthermore, the entire channel formation region of the semiconductor layer 742 can be depleted by the electric field of the gate 743. Accordingly, the off-state current of the s-channel transistor can be further reduced.

A back gate 723 is provided over an insulating layer 378.

A conductive layer 744a provided over an insulating layer 729 is electrically connected to the semiconductor layer 742 through an opening 747c formed in the gate insulating layer 311, an insulating layer 728, and the insulating layer 729. A conductive layer 744b provided over the insulating layer 729 is electrically connected to the semiconductor layer 742 through an opening 747d formed in the gate insulating layer 311 and the insulating layers 728 and 729.

The gate 743 provided over the gate insulating layer 311 is electrically connected to the back gate 723 through an opening 747a and an opening 747b formed in the gate insulating layer 311 and the insulating layer 772. Accordingly, the same potential is supplied to the gate 743 and the back gate 723. Furthermore, either or both of the openings 747a and 747b may be omitted. In the case where both the openings 747a and 747b are omitted, different potentials can be supplied to the back gate 723 and the gate 743.

As a semiconductor in a transistor having an s-channel structure, an oxide semiconductor, silicon such as polycrystalline silicon or single crystal silicon that is transferred from a single crystal silicon substrate, or the like is used.

<Structure Example 6>

Figure 14:
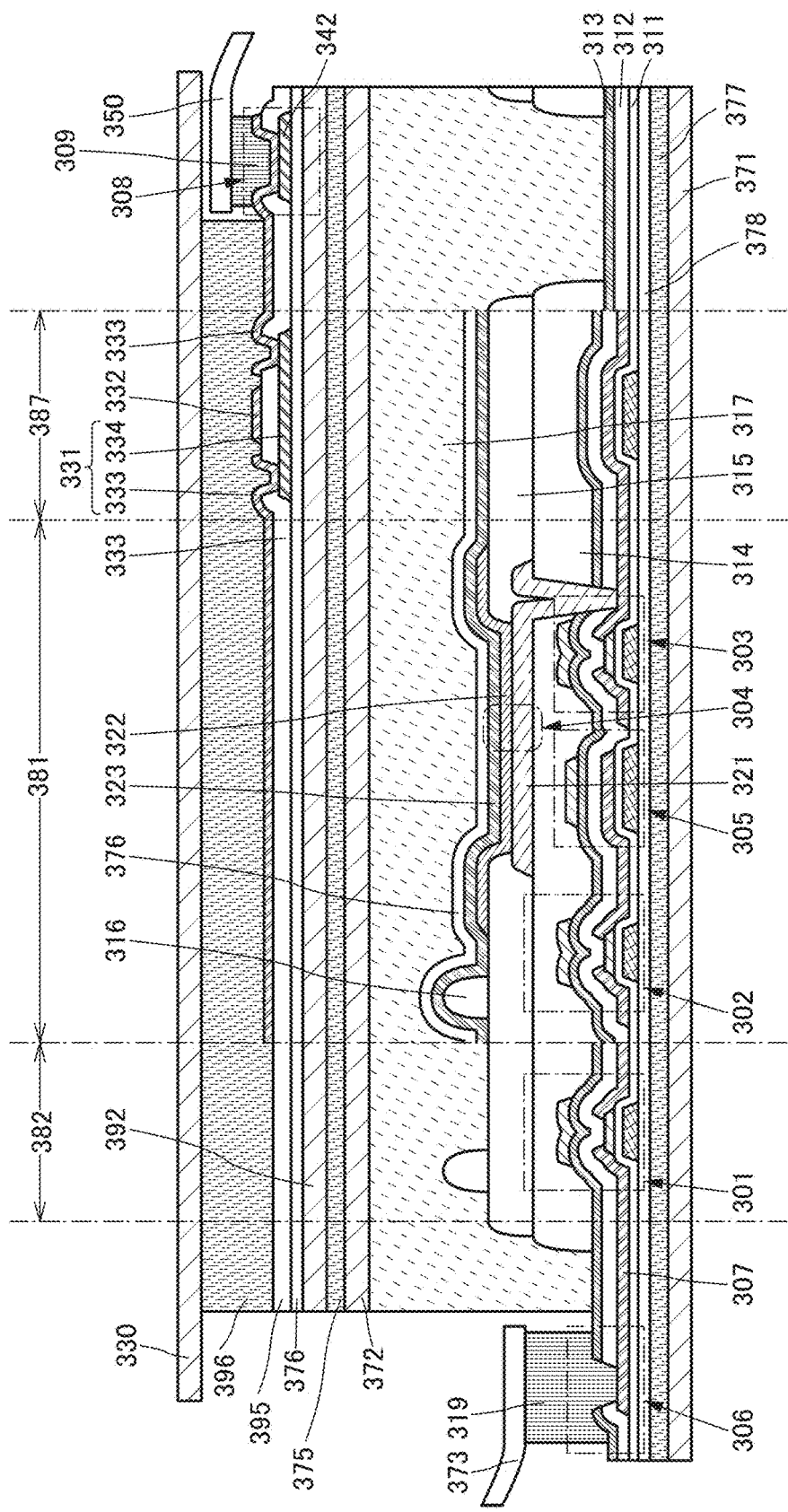
FIG. 14 is a cross-sectional view illustrating an example of a touch panel.

FIG. 14 illustrates an example of a touch panel in which a light-emitting panel using a separate coloring method and an input panel are attached to each other with the adhesive layer 375.

The light-emitting panel in FIG. 14 has a structure similar to that in FIG. 10B.

The input panel in FIG. 14 includes the insulating layer 376 over a substrate 392, and the electrode 334 and the wiring 342 over the insulating layer 376. The electrode 334 and the wiring 342 are covered with the insulating layer 395. The electrode 332 and the electrode 333 are provided over the insulating layer 395. The substrate 330 is attached to the substrate 392 with the adhesive layer 396.

<Structure Example 7>

Figure 15:
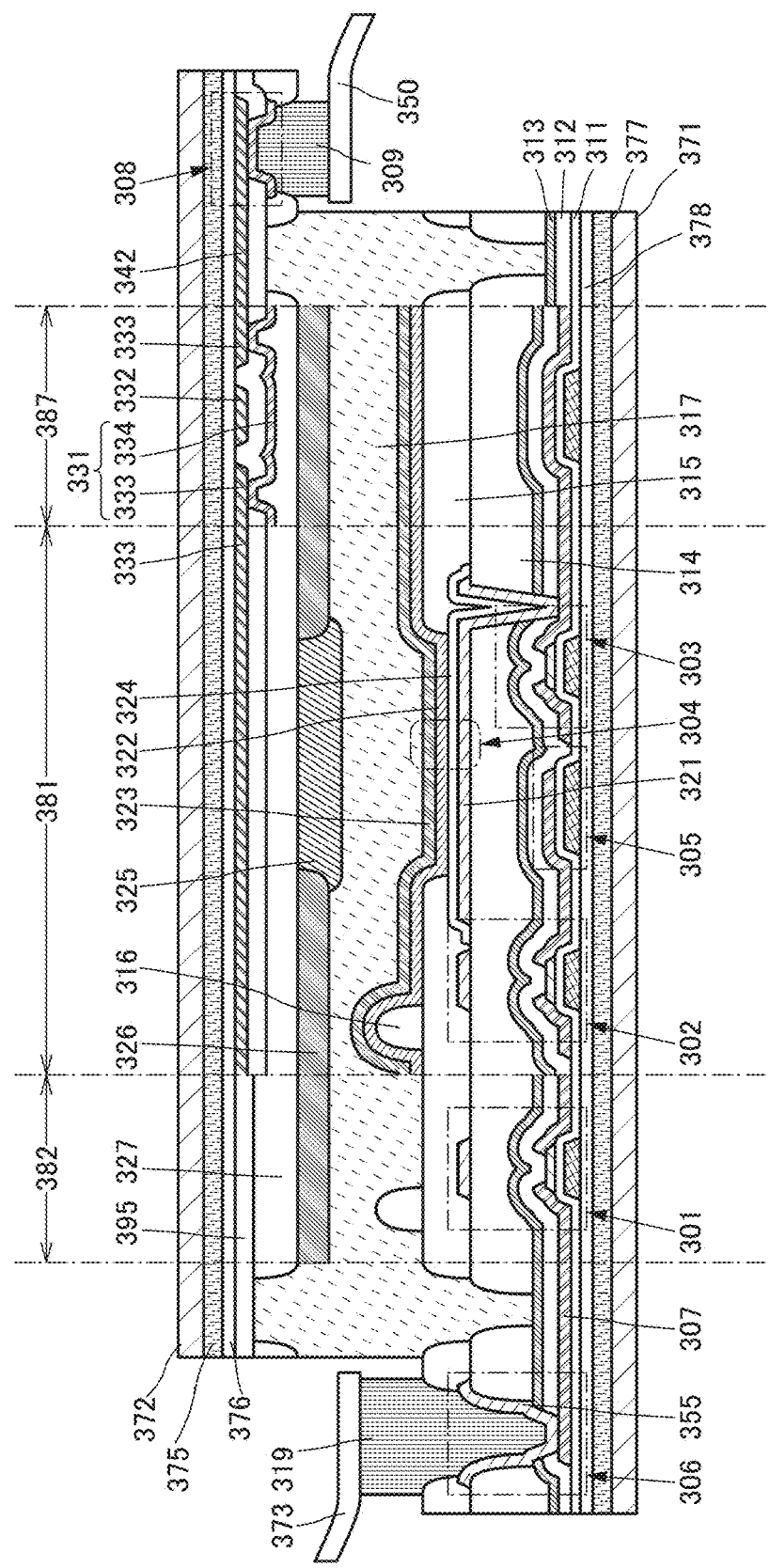
FIG. 15 is a cross-sectional view illustrating an example of a touch panel.

FIG. 15 illustrates an example in which a touch sensor and the light-emitting element 304 are provided between a pair of flexible substrates (the substrate 371 and the substrate 372). When two flexible substrates are used, the touch panel can be thin, lightweight, and flexible.

A light-emitting panel illustrated in FIG. 15 can be manufactured using the separation method described in Embodiment 1. Specifically, the insulating layer 378, a plurality of transistors, the capacitor 305, the conductive layer 307, the insulating layers 312 to 315, the light-emitting element 304, the conductive layer 355, and the spacer 316 are formed over a formation substrate as a layer to be separated. In addition, the insulating layer 376, the electrode 332, the electrode 333, the wiring 342, the insulating layer 395, the electrode 334, an insulating layer 327, the coloring layer 325, and the light-blocking layer 326 are formed over another formation substrate as a layer to be separated. The pair of formation substrates are attached to each other with the adhesive layer 317 and then the formation substrates are removed by separation. There is no particular limitation on the separation order of the formation substrates. For example, in the case where the formation substrate over which the transistors are formed is separated first, the exposed insulating layer 378 and the substrate 371 are then attached to each other with the adhesive layer 377. After that, a separation starting point is formed by the method for forming a separation starting point that is one embodiment of the present invention. Next, the remaining formation substrate is separated, and the exposed insulating layer 376 and the substrate 372 are attached to each other with the adhesive layer 375.

<Structure Example 8>

Figure 16A:
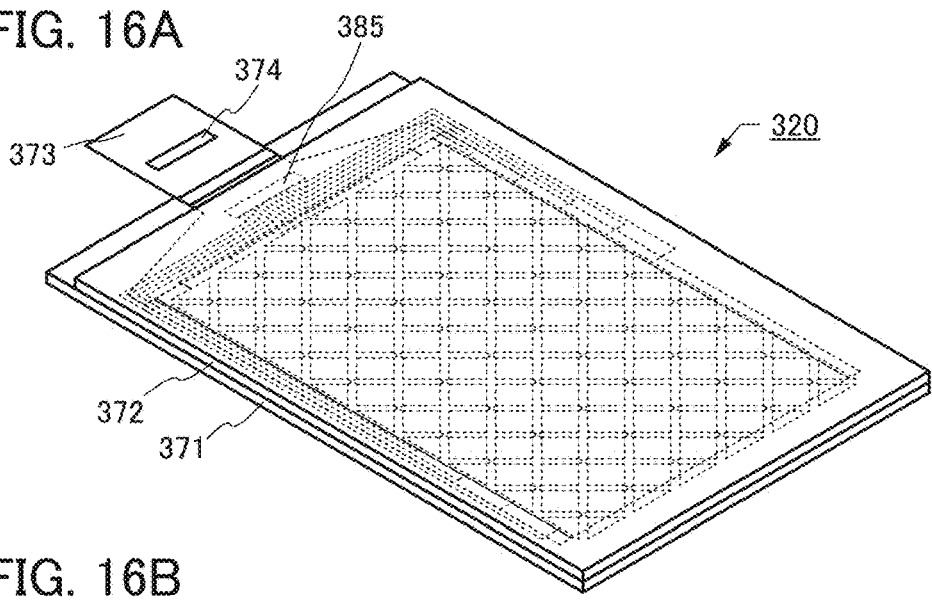
FIGS. 16A and 16B are perspective views illustrating an example of a touch panel.
Figure 16B:
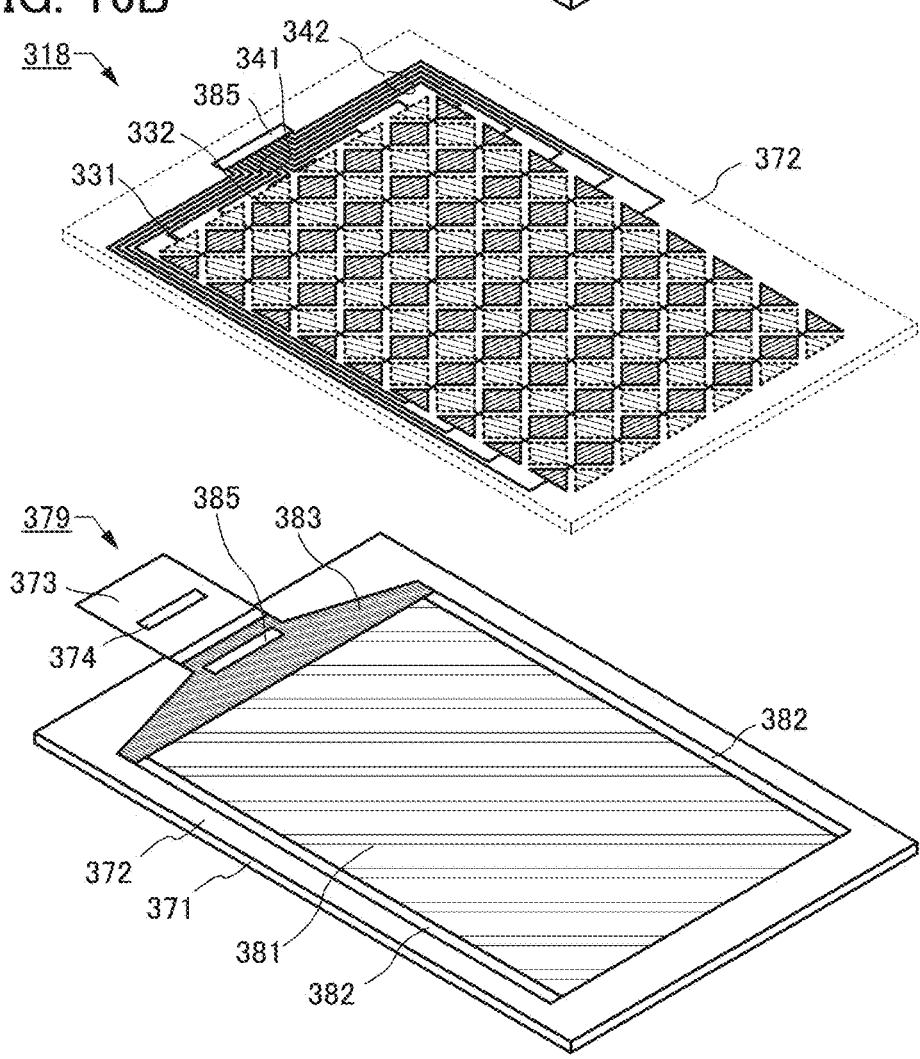

FIGS. 16A and 16B are schematic perspective views of a touch panel 320.

In FIGS. 16A and 16B, the substrate 372 is provided with an input panel 318. The wiring 341, the wiring 342, and the like of the input panel 318 are electrically connected to the FPC 373 provided for the light-emitting panel 379.

With the above structure, the FPC connected to the touch panel 320 can be provided only on one substrate side (here, on the substrate 371 side). Although two or more FPCs may be attached to the touch panel 320, it is preferable that the touch panel 320 be provided with one FPC 373 which has a function of supplying signals to both the light-emitting panel 379 and the input panel 318 as illustrated in FIGS. 16A and 16B, for the simplicity of the structure.

The IC 374 can have a function of driving the input panel 318. Alternatively, an IC for driving the input panel 318 may further be provided. Further alternatively, an IC for driving the input panel 318 may be mounted on the substrate 371.

Figure 17:
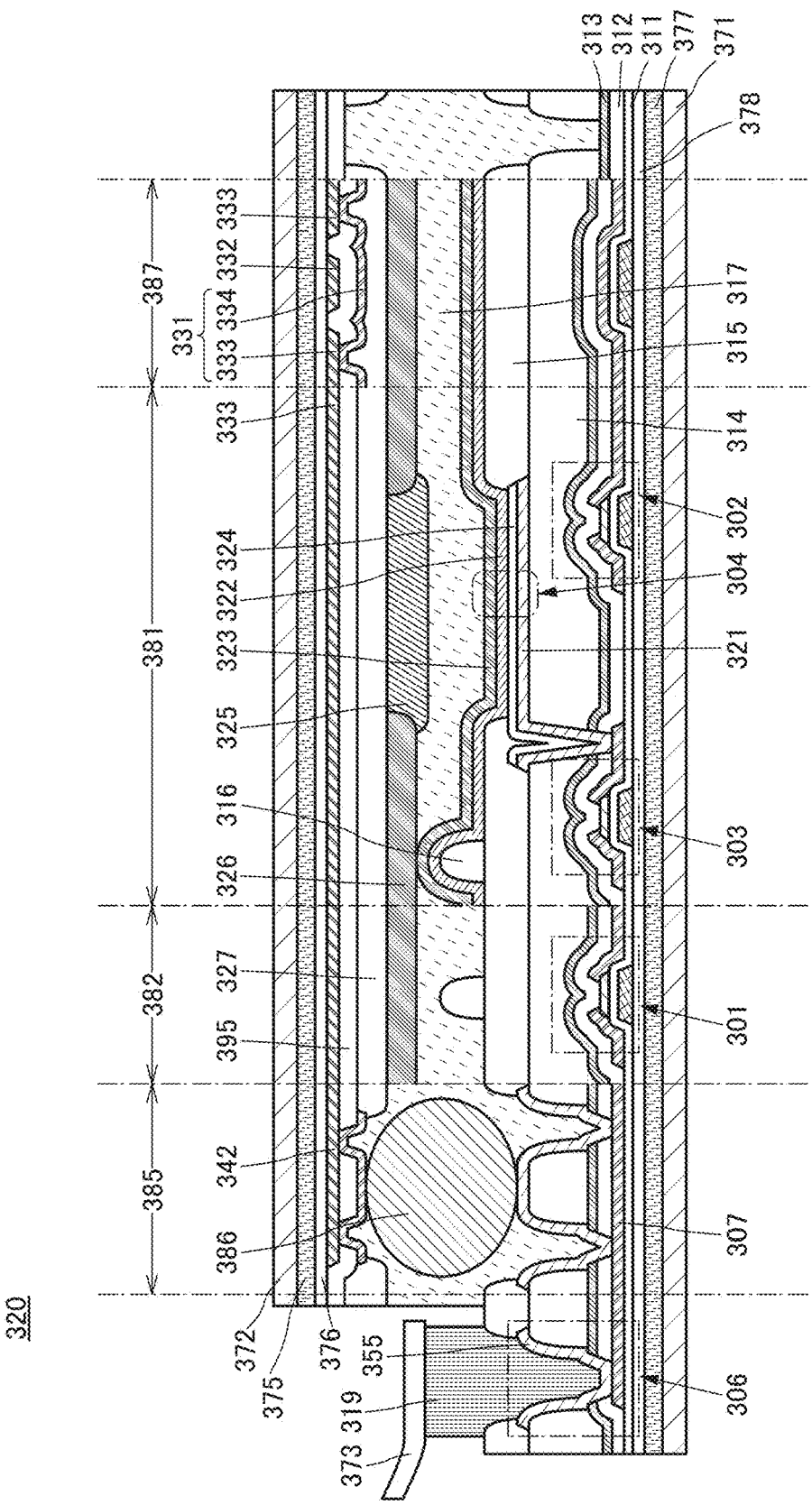
FIG. 17 is a cross-sectional view illustrating an example of a touch panel.

FIG. 17 is a cross-sectional view illustrating a region including the FPC 373, a connection portion 385, the driver circuit portion 382, and the light-emitting portion 381 in FIGS. 16A and 16B.

In the connection portion 385, one of the wirings 342 (or the wirings 341) and one of the conductive layers 307 are electrically connected to each other through a connector 386.

As the connector 386, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 386, a material capable of elastic deformation or plastic deformation is preferably used. As illustrated in FIG. 17, the conductive particle has a shape that is vertically crushed in some cases. With the crushed shape, the contact area between the connector 386 and a conductive layer electrically connected to the connector 386 can be increased, thereby reducing contact resistance and suppressing the generation of problems such as disconnection.

The connector 386 is preferably provided so as to be covered with the adhesive layer 317. For example, the connectors 386 are dispersed in the adhesive layer 317 before curing of the adhesive layer 317. A structure in which the connection portion 385 is provided in a portion where the adhesive layer 317 is provided can be similarly used not only to a structure in which the adhesive layer 317 is also provided over the light-emitting element 304 as illustrated in FIG. 17 (also referred to as a solid sealing structure) but also to, for example, a hollow sealing structure in which the adhesive layer 317 is provided in the periphery of a light-emitting panel, a liquid crystal display panel, or the like.

FIG. 17 illustrates an example in which the optical adjustment layer 324 does not cover an end portion of the electrode 321. In the example in FIG. 17, the spacer 316 is also provided in the driver circuit portion 382.

<Structure Example 9>

In a touch panel illustrated in FIG. 18A, the light-blocking layer 326 is provided between the electrodes and the like in the touch sensor and the substrate 372. Specifically, the light-blocking layer 326 is provided between the insulating layer 376 and an insulating layer 328. Conductive layers such as the electrode 332, the electrode 333, and the wiring 342, the insulating layer 395 covering the conductive layers, the electrode 334 over the insulating layer 395, and the like are provided over the insulating layer 328 when seen from the substrate 372 side. Furthermore, the insulating layer 327 is provided over the electrode 334 and the insulating layer 395, and the coloring layer 325 is provided over the insulating layer 327.

The insulating layers 327 and 328 have a function as a planarization film. Note that the insulating layers 327 and 328 are not necessarily provided when not needed.

With such a structure, the light-blocking layer 326 provided in a position closer to the substrate 372 side than the electrodes and the like in the touch sensor can prevent the electrodes and the like from being visually recognized by a user. Thus, a touch panel with not only a small thickness but also improved display quality can be achieved.

As illustrated in FIG. 18B, the touch panel may include a light-blocking layer 326a between the insulating layer 376 and the insulating layer 328 and may include a light-blocking layer 326b between the insulating layer 327 and the adhesive layer 317. Providing the light-blocking layer 326b can inhibit light leakage more surely.

This embodiment can be combined with any of other embodiments as appropriate.

(Embodiment 3)

In this embodiment, electronic devices and lighting devices of one embodiment of the present invention will be described with reference to drawings.

Highly reliable electronic devices or lighting devices can be manufactured with a high yield by the method for forming a separation starting point that is one embodiment of the present invention. In addition, highly reliable electronic devices or lighting devices with curved surfaces or flexibility can be manufactured with a high yield by the method for forming a separation starting point that is one embodiment of the present invention.

Examples of electronic devices include a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, and a large-sized game machine such as a pachinko machine.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

FIGS. 19A, 19B, 19C1, 19C2, 19D, and 19E illustrate examples of electronic devices each including a display portion 7000 with a curved surface. The display surface of the display portion 7000 is curved, and images can be displayed on the curved display surface. Note that the display portion 7000 may be flexible.

The display portion 7000 includes the light-emitting device, display device, input/output device, or the like manufactured using the method for forming a separation starting point that is one embodiment of the present invention.

One embodiment of the present invention makes it possible to provide a highly reliable electronic device having a curved display portion.

FIG. 19A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 19A includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching images from a mail creation screen to a main menu screen is performed with the operation button 7103.

FIG. 19B illustrates an example of a television set. In a television set 7200, the display portion 7000 is incorporated in a housing 7201. Here, the housing 7201 is supported by a stand 7203.

The television set 7200 illustrated in FIG. 19B can be operated with an operation switch of the housing 7201 or a separate remote controller 7211. The display portion 7000 may include a touch sensor, and can be operated by touch on the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 19C1, 19C2, 19D, and 19E illustrate examples of portable information terminals. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 19C1 is a perspective view of a portable information terminal 7300. FIG. 19C2 is a top view of the portable information terminal 7300. FIG. 19D is a perspective view of a portable information terminal 7310. FIG. 19E is a perspective view of a portable information terminal 7320.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7300, 7310, and 7320 can each display characters, image information, and the like on its plurality of surfaces. For example, as illustrated in FIGS. 19C1 and 19D, three operation buttons 7302 can be displayed on one surface, and information 7303 indicated by a rectangle can be displayed on another surface. FIGS. 19C1 and 19C2 illustrate an example in which information is displayed at the top of the portable information terminal. FIG. 19D illustrates an example in which information is displayed on the side of the portable information terminal. Information may be displayed on three or more surfaces of the portable information terminal. FIG. 19E illustrates an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in the position that can be seen from above the portable information terminal 7300. Thus, the user can see the display without taking out the portable information terminal 7300 from the pocket and decide whether to answer the call.

FIGS. 19F to 19H each illustrate an example of a lighting device having a curved light-emitting portion.

The light-emitting portion included in the lighting device illustrated in each of FIGS. 19F to 19H includes the light-emitting device or the like manufactured using the method for forming a separation starting point that is one embodiment of the present invention.

One embodiment of the present invention makes it possible to provide a highly reliable lighting device having a curved light-emitting portion.

A lighting device 7400 illustrated in FIG. 19F includes a light-emitting portion 7402 with a wave-shaped light-emitting surface and thus is a good-design lighting device.

A light-emitting portion 7412 included in a lighting device 7410 illustrated in FIG. 19G has two convex-curved light-emitting portions symmetrically placed. Thus, all directions can be illuminated with the lighting device 7410 as a center.

A lighting device 7420 illustrated in FIG. 19H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410, and 7420 may be flexible. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

FIGS. 20A1, 20A2, 20B, 20C, 20D, 20E, 20F, 20G, 20H, and 20I each illustrate an example of a portable information terminal including a display portion 7001 having flexibility.

The display portion 7001 includes the light-emitting device, display device, input/output device, or the like manufactured using the method for forming a separation starting point that is one embodiment of the present invention. For example, a light-emitting device, a display device, or an input/output device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like.

One embodiment of the present invention makes it possible to provide a highly reliable electronic device including a display portion having flexibility.

FIGS. 20A1 and 20A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out by using the display portion tab 7502.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed videos, and the like can be performed. Although FIGS. 20A1, 20A2, and 20B illustrate an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 20B illustrates the portable information terminal 7500 in a state where the display portion 7001 is pulled out. Images can be displayed on the display portion 7001 in this state. In addition, the portable information terminal 7500 may perform different displays in the state where part of the display portion 7001 is rolled as illustrated in FIG. 20A1 and in the state where the display portion 7001 is pulled out as illustrated in FIG. 20B. For example, in the state illustrated in FIG. 20A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 20C to 20E illustrate an example of a foldable portable information terminal. FIG. 20C illustrates a portable information terminal 7600 that is opened. FIG. 20D illustrates the portable information terminal 7600 that is being opened or being folded. FIG. 20E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 20F and 20G illustrate an example of a foldable portable information terminal. FIG. 20F illustrates a portable information terminal 7650 that is folded so that the display portion 7001 is on the inside. FIG. 20G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

FIG. 20H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be provided to overlap with the display portion 7001, for example.

The housing 7701, the display portion 7001, and the battery 7709 are flexible. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 20I illustrates an example of a wrist-watch-type portable information terminal. A portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be provided to overlap with the display portion 7001 or the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 21A:
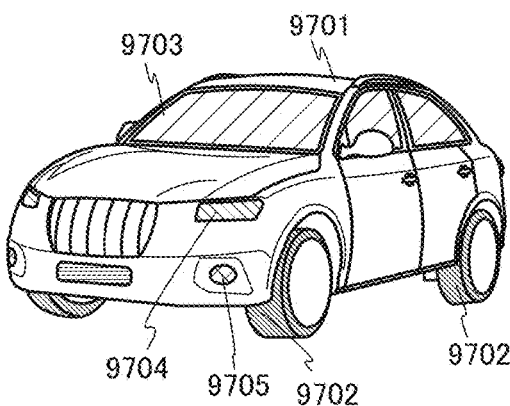
FIGS. 21A to 21E illustrate examples of electronic devices.
Figure 21B:
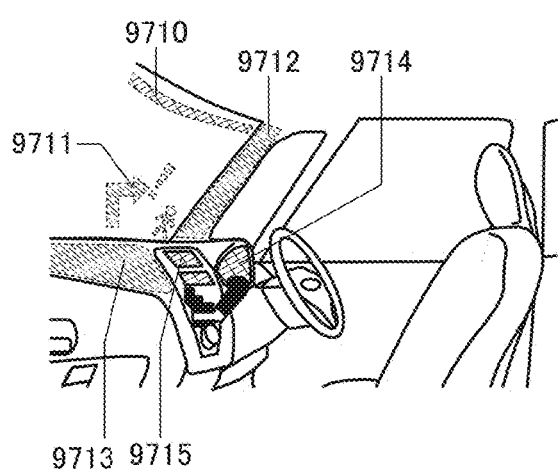

FIG. 21A is an external view of an automobile 9700. FIG. 21B illustrates a driver's seat of the automobile 9700. The automobile 9700 includes a car body 9701, wheels 9702, a windshield 9703, lights 9704, fog lamps 9705, and the like. The light-emitting device, display device, input/output device, or the like manufactured using the method for forming a separation starting point that is one embodiment of the present invention can be used in a display portion or the like of the automobile 9700. For example, the light-emitting device or the like can be used in display portions 9710 to 9715 illustrated in FIG. 21B. Alternatively, the light-emitting device or the like may be used in the lights 9704 or the fog lamps 9705.

The display portion 9710 and the display portion 9711 are display devices provided in an automobile windshield. The light-emitting device or the like of one embodiment of the present invention can be a see-through device, through which the opposite side can be seen, by using a light-transmitting conductive material for its electrodes and wirings. Such a see-through display portion 9710 or 9711 does not hinder driver's vision during driving of the automobile 9700. Thus, the light-emitting device or the like of one embodiment of the present invention can be provided in the windshield of the automobile 9700. Note that in the case where a transistor or the like for driving the light-emitting device or the like is provided, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 21C:
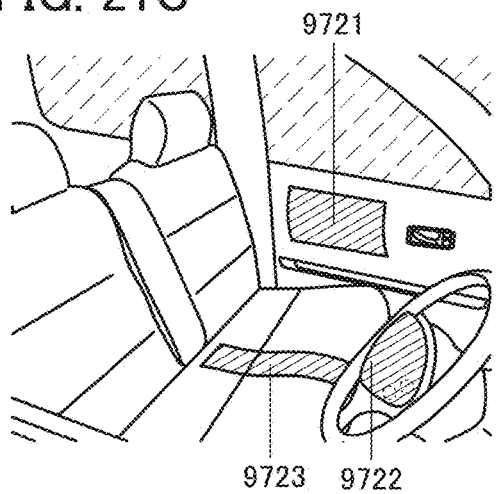

FIG. 21C illustrates the inside of an automobile in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portion in which the light-emitting device, display device, input/output device, or the like manufactured using the method for forming a separation starting point that is one embodiment of the present invention is used may have a flat surface.

Figure 21D:
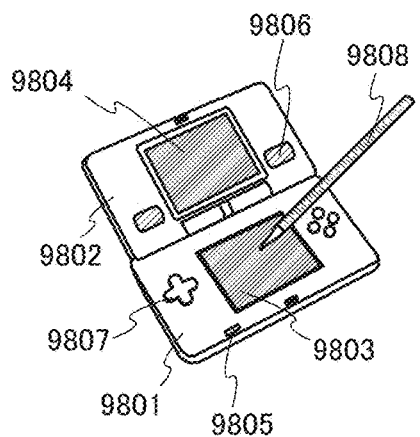

FIG. 21D illustrates a portable game console including a housing 9801, a housing 9802, a display portion 9803, a display portion 9804, a microphone 9805, a speaker 9806, an operation key 9807, a stylus 9808, and the like.

The portable game console illustrated in FIG. 21D includes two display portions 9803 and 9804. Note that the number of display portions of an electronic device of one embodiment of the present invention is not limited to two and can be one or three or more.

Figure 21E:
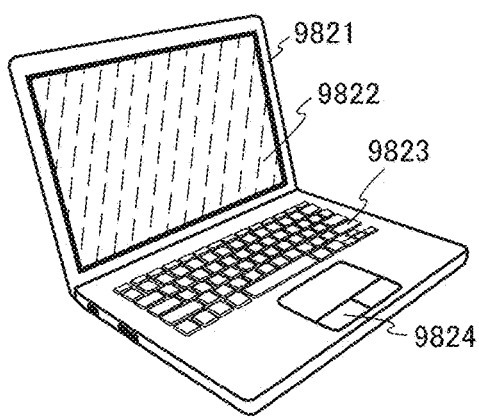

FIG. 21E illustrates a laptop personal computer including a housing 9821, a display portion 9822, a keyboard 9823, a pointing device 9824, and the like.

This embodiment can be combined with any of other embodiments as appropriate.

EXAMPLE 1

In this example, the method for forming a separation starting point that is one embodiment of the present invention is described.

Figure 22A:
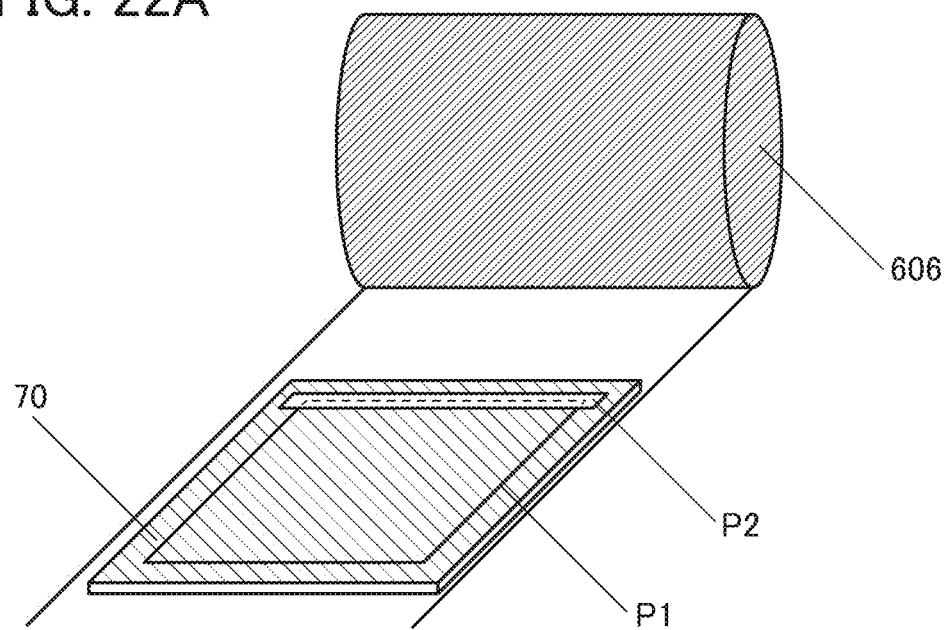
FIGS. 22A and 22B illustrate an example of a separation method.
Figure 22B:
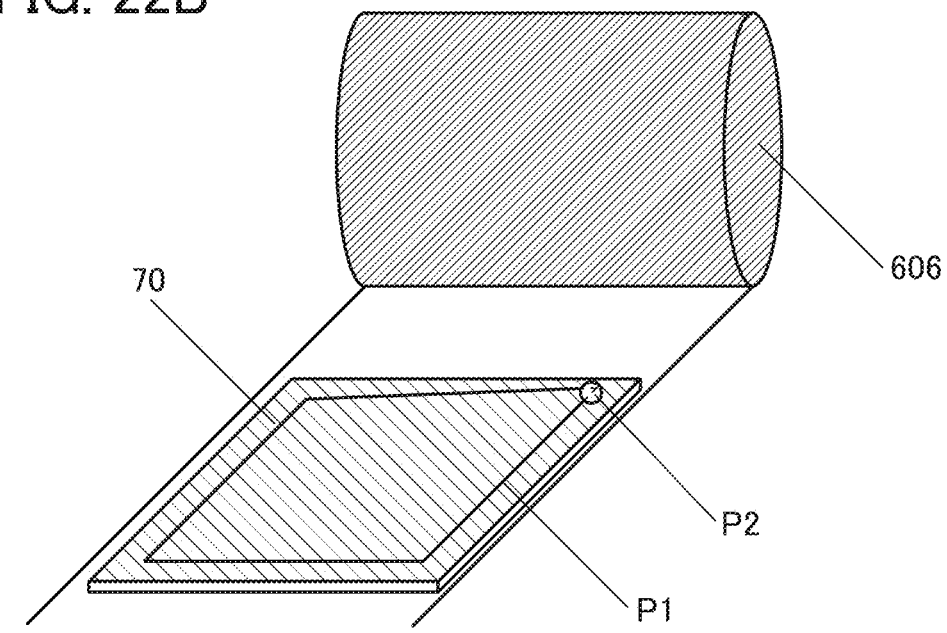

FIGS. 22A and 22B illustrate an example of a method for forming a separation starting point for separation with the press roller 606 (see FIG. 7).

The process member 70 illustrated in FIG. 22A is irradiated with the first laser light P1 in a quadrangular frame-like shape along the four sides of the process member 70. Then, the entire one side of the quadrangular frame which has been irradiated with the first laser light P1 is irradiated with the second laser light P2.

A cut is made in the process member 70 by the irradiation with the first laser light P1. In the case where the separation is started from one side of the cut, the entire side where the separation is started is preferably irradiated with the second laser light P2 because the yield can be increased.

In the case where the separation is started from a corner portion of the cut, at least the corner portion of the cut is irradiated with the second laser light P2; thus, the area of the region which is irradiated with the second laser light P2 can be reduced as compared with the case where the separation is started from the side portion. The direction of the process member 70 relative to the press roller 606 may be changed in order to start the separation from the corner portion of the cut; however, in that case, a transfer method of the process member 70 might become complicated and the size of a separation apparatus might be increased.

In view of the above, in this example, the process member 70 is placed so that the side of the process member 70 is substantially parallel to the length direction of the press roller 606 as illustrated in FIG. 22B. In FIG. 22B, the short side of the process member 70 is substantially parallel to the length direction of the press roller 606; however, one embodiment of the present invention is not limited thereto. In addition, the process member 70 is placed so that one side of the cut is oblique to the length direction of the press roller 606. Specifically, the process member 70 is irradiated with the first laser light P1 in a quadrangular frame-like shape. At least one side of the quadrangular frame is neither perpendicular to the long side of the process member 70 nor parallel to the short side of the process member 70, i.e., is oblique to each side of the process member 70. Furthermore, a corner portion of the cut from which the separation is started (i.e., a corner portion that is the closest to the press roller 606) is irradiated with the second laser light P2. In this manner, the transfer method of the process member 70 can be prevented from becoming complicated, and an increase in the size of the separation apparatus can be suppressed. In addition, since the separation can be started from the corner portion of the cut formed in the process member 70, the area of the region which is irradiated with the second laser light P2 can be reduced and therefore a separation starting point can be formed in a short time.

Figure 23A:
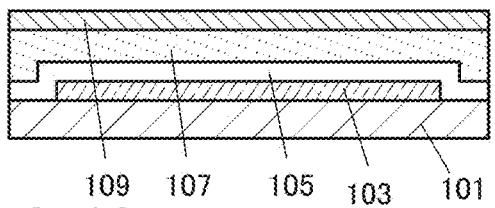
FIGS. 23A to 23D illustrate examples of a method for forming a separation starting point.

FIG. 23A is a schematic cross-sectional view of a process member used in this example. A glass substrate was used as the formation substrate 101. A tungsten film was used as the separation layer 103. A layer containing an oxide of tungsten was formed by performing plasma treatment on a surface of the separation layer 103. The layer containing an oxide of tungsten was formed thin such that the cross section thereof can hardly be observed with an electron microscope or the like. The layer to be separated 105 includes a transistor including an oxide semiconductor, an insulating layer such as a silicon nitride layer, and the like. A thermosetting adhesive was used for the adhesive layer 107. An organic resin film was used as the substrate 109.

Figure 23B:
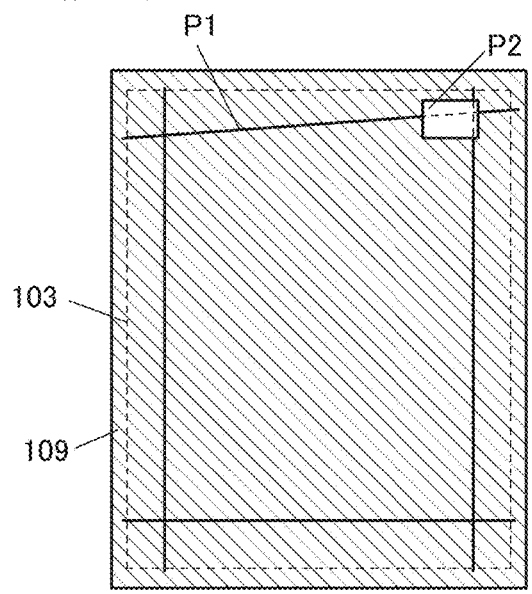

FIG. 23B illustrates a region which was irradiated with the first laser light P1 and a region which was irradiated with the second laser light P2 in this example.

Figure 23C:
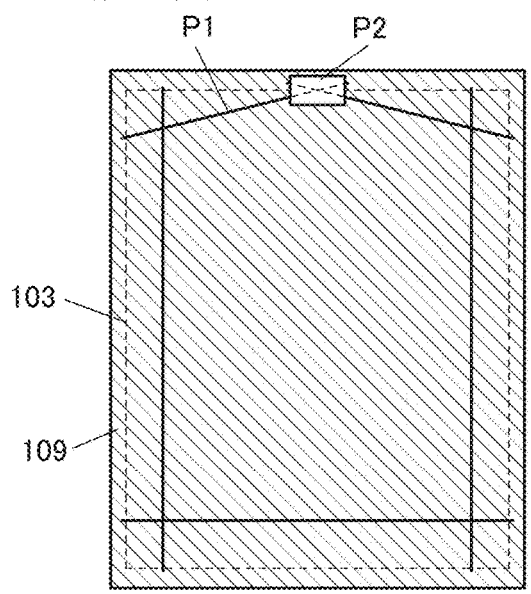

FIG. 23B illustrates an example in which a separation starting portion is positioned in the vicinity of a corner portion of the process member 70; however, one embodiment of the present invention is not limited thereto. FIG. 23C illustrates an example in which the process member 70 is irradiated with the first laser light P1 in a pentagonal frame-like shape. The separation starting portion can also be formed in the vicinity of a side portion of the process member 70.

Figure 23D:
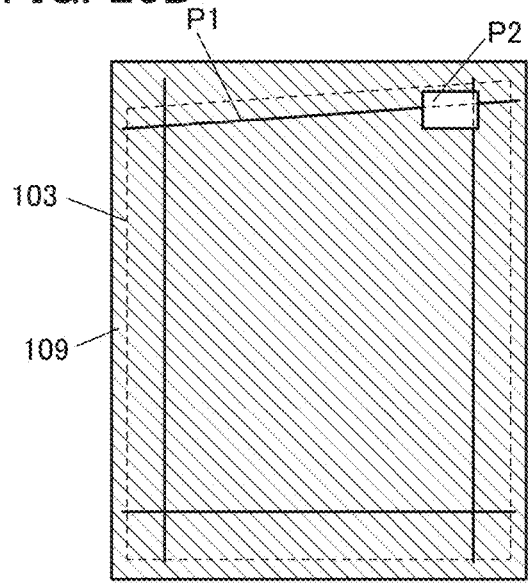

As illustrated in FIG. 23B, the separation layer 103 fabricated in this example has a top-view shape along the four sides of the formation substrate 101; however, one embodiment of the present invention is not limited thereto. FIG. 23D illustrates an example in which one side of the separation layer 103 and one side of the region which is irradiated with the first laser light P1 are oblique to the sides of the formation substrate 101.

Figure 24:
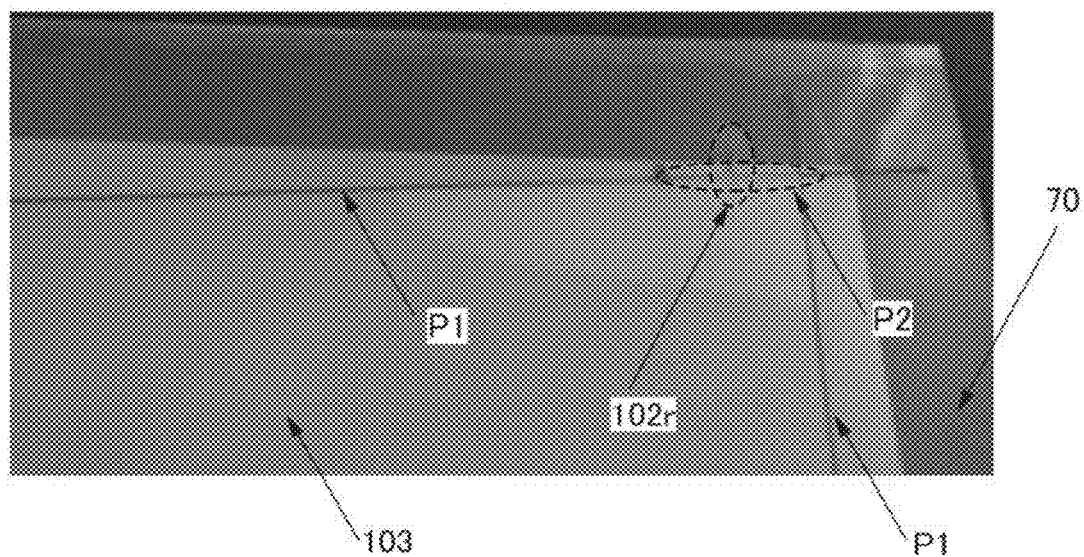
FIG. 24 is a photograph of a process member in which a separation starting point is formed.

FIG. 24 is a photograph showing the process member 70 with a separation starting point. The region which was irradiated with the first laser light P1 and the region which was irradiated with the second laser light P2 partly overlap with the separation layer 103. A needle was inserted from an end portion of the process member 70 after the irradiation with the first and second laser light. A region 102r represents a portion where the needle was inserted. Lifting of a film due to the insertion of the needle was observed. This indicates that the separation starting point was formed successfully.

This application is based on Japanese Patent Application ser. no. 2016-011991 filed with Japan Patent Office on Jan. 26, 2016, the entire contents of which are hereby incorporated by reference.

What is claimed is:

1. A method for forming a separation starting point, comprising:
   a first step of irradiating a first portion of a process member with first laser light in a frame-like shape; and
   a second step of irradiating a second portion of the process member with second laser light,
   wherein the first portion and the second portion at least partly overlap with each other,
   wherein the process member comprises a first substrate, a separation layer, a layer to be separated, and an adhesive layer which are stacked in this order,
   wherein in the first portion, the adhesive layer overlaps with the first substrate with the separation layer and the layer to be separated provided between the adhesive layer and the first substrate,
   wherein in the first step, the first laser light is absorbed by at least the layer to be separated and the adhesive layer,
   wherein in the second step, the second laser light is absorbed by at least the separation layer, and wherein a width of the second portion which is irradiated with the second laser light is larger than a width of the first portion which is irradiated with the first laser light.

2. The method for forming a separation starting point according to claim 1,
wherein the first laser light is ultraviolet light, and
wherein the second laser light is visible light.

3. The method for forming a separation starting point according to claim 1, wherein in the first step, the layer to be separated and the adhesive layer are cut.

4. The method for forming a separation starting point according to claim 1, wherein in the second step, at least part of the separation layer is separated from the layer to be separated.

5. The method for forming a separation starting point according to claim 1, wherein the irradiation with the first laser light and the irradiation with the second laser light are performed from the adhesive layer side to the first substrate side.

6. The method for forming a separation starting point according to claim 1, wherein the second step is performed after the first step.

7. The method for forming a separation starting point according to claim 1, wherein the first step is performed after the second step.

8. The method for forming a separation starting point according to claim 1,
wherein the process member further comprises a second substrate,
wherein the second substrate and the layer to be separated are attached to each other with the adhesive layer, and
wherein in the first step, the first laser light is absorbed by at least the second substrate, the layer to be separated, and the adhesive layer.

9. The method for forming a separation starting point according to claim 1, wherein the separation layer comprises tungsten.

10. A separation method comprising the steps of:
forming the separation layer over the first substrate,
forming the layer to be separated over and in contact with the separation layer,
forming the adhesive layer over the separation layer and the layer to be separated and curing the adhesive layer,
forming a separation starting point by the method for forming a separation starting point according to claim 1, and
separating the layer to be separated from the separation layer from the separation starting point.

11. A method for manufacturing a device comprising the steps of:
irradiating a first portion of a process member with first laser light in a frame-like shape; and
irradiating a second portion of the process member with second laser light,
wherein a frame-like shaped region which is irradiated with the first laser light comprises at least four sides,
wherein the second portion overlaps with an entire one side of the frame-like shaped region,
wherein the process member comprises a separation layer, a layer to be separated, and an adhesive layer which are stacked in this order,
wherein in the first portion, the adhesive layer overlaps with the separation layer with the layer to be separated provided between the adhesive layer and the separation layer,
wherein the first laser light and the second laser light have different wavelengths,
wherein the layer to be separated and the adhesive layer are cut by the irradiation with the first laser light, and
wherein at least part of the separation layer is separated from the layer to be separated by the irradiation with the second laser light.

12. The method for manufacturing a device according to claim 11,
wherein the first laser light is ultraviolet light, and
wherein the second laser light is visible light.

13. The method for manufacturing a device according to claim 11, wherein the irradiation with the first laser light and the irradiation with the second laser light are performed from the same surface side.

14. The method for manufacturing a device according to claim 11, wherein the irradiation with the first laser light and the irradiation with the second laser light are performed from the adhesive layer side to the separation layer side.

15. The method for manufacturing a device according to claim 11, wherein the irradiation with the second laser light is performed after the irradiation with the first laser light.

16. The method for manufacturing a device according to claim 11, wherein the irradiation with the first laser light is performed after the irradiation with the second laser light.

17. The method for manufacturing a device according to claim 11, wherein the separation layer comprises tungsten.

18. A method for manufacturing a device comprising the steps of:
irradiating a first portion of a process member with first laser light in a frame-like shape; and
irradiating a second portion of the process member with second laser light,
wherein a frame-like shaped region which is irradiated with the first laser light comprises at least four sides,
wherein the second portion overlaps with an entire one side of the frame-like shaped region,
wherein the process member comprises a first substrate, a separation layer, a layer to be separated, and an adhesive layer which are stacked in this order,
wherein in the first portion, the adhesive layer overlaps with the first substrate with the separation layer and the layer to be separated provided between the adhesive layer and the first substrate,
wherein the first laser light is absorbed by at least the layer to be separated and the adhesive layer, and
wherein the second laser light is absorbed by at least the separation layer.

19. The method for manufacturing a device according to claim 18, wherein at least one of the sides comprising the frame-like shaped region is not parallel to three sides of the process member.

20. The method for manufacturing a device according to claim 18,
wherein the first laser light is ultraviolet light, and
wherein the second laser light is visible light.

21. The method for manufacturing a device according to claim 18, wherein the separation layer comprises tungsten.

* * * * *